(12) United States Patent
Hua et al.

(10) Patent No.: US 9,704,829 B2
(45) Date of Patent: Jul. 11, 2017

(54) STACKED STRUCTURE OF SEMICONDUCTOR CHIPS HAVING VIA HOLES AND METAL BUMPS

(71) Applicant: WIN Semiconductors Corp., Kuei Shan Hsiang, Tao Yuan Shien (TW)

(72) Inventors: Chang-Hwang Hua, Tao Yuan Shien (TW); Chih-Hsien Lin, Tao Yuan Shien (TW)

(73) Assignee: Win Semiconductor Corp., Guishan District, Taoyuan (TW)

( * ) Notice: Subject to any disclaimer, the term of this patent is extended or adjusted under 35 U.S.C. 154(b) by 0 days.

(21) Appl. No.: 14/883,135

(22) Filed: Oct. 14, 2015

(65) Prior Publication Data

US 2016/0035707 A1  Feb. 4, 2016

Related U.S. Application Data

(63) Continuation-in-part of application No. 13/968,797, filed on Aug. 16, 2013, now Pat. No. 9,190,374.

(30) Foreign Application Priority Data

Mar. 6, 2013 (TW) .............................. 102107918 A

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/291* (2013.01); *H01L 23/3171* (2013.01); *H01L 23/4827* (2013.01); *H01L 24/13* (2013.01); *H01L 24/16* (2013.01); *H01L 25/50* (2013.01); *H01L 23/481* (2013.01); *H01L 24/03* (2013.01); *H01L 24/05* (2013.01); *H01L 24/06* (2013.01); *H01L 24/48* (2013.01); *H01L 24/73* (2013.01);
(Continued)

(58) Field of Classification Search
CPC . H01L 25/0657; H01L 23/4827; H01L 25/50; H01L 2924/00014
See application file for complete search history.

(56) References Cited

U.S. PATENT DOCUMENTS 6,175,160 B1 *  1/2001  Paniccia ............... H01L 23/481
                                                                     257/777
7,521,799 B2     4/2009  Hayashi et al.
(Continued)

*Primary Examiner* — Laura Menz
(74) *Attorney, Agent, or Firm* — Muncy, Geissler, Olds & Lowe, P.C.

(57) ABSTRACT

A stacked structure comprises a semiconductor chip which includes a substrate having at least one substrate via hole penetrating through the substrate; at least one backside metal layer formed on a backside of the substrate covering an inner surface of the substrate via hole and at least part of the backside of the substrate; at least one front-side metal layer formed on the front-side of the substrate and electrically connected to the at least one backside metal layer on a top of at least one of the at least one substrate via hole; at least one electronic device formed on the front-side of the substrate and electrically connected to the at least one front-side metal layer; and at least one metal bump formed on at least one of the backside metal layer and the front-side metal layer.

30 Claims, 22 Drawing Sheets

(51) Int. Cl.
*H01L 23/31* (2006.01)
*H01L 23/29* (2006.01)
*H01L 23/482* (2006.01)
*H01L 25/00* (2006.01)
*H01L 23/48* (2006.01)

(52) U.S. Cl.
CPC .... *H01L 24/92* (2013.01); *H01L 2224/02372* (2013.01); *H01L 2224/03002* (2013.01); *H01L 2224/0401* (2013.01); *H01L 2224/04042* (2013.01); *H01L 2224/0557* (2013.01); *H01L 2224/05548* (2013.01); *H01L 2224/05558* (2013.01); *H01L 2224/05567* (2013.01); *H01L 2224/05568* (2013.01); *H01L 2224/05573* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/06181* (2013.01); *H01L 2224/13024* (2013.01); *H01L 2224/13082* (2013.01); *H01L 2224/13109* (2013.01); *H01L 2224/13111* (2013.01); *H01L 2224/13144* (2013.01); *H01L 2224/13147* (2013.01); *H01L 2224/13609* (2013.01); *H01L 2224/13611* (2013.01); *H01L 2224/14181* (2013.01); *H01L 2224/16145* (2013.01); *H01L 2224/16148* (2013.01); *H01L 2224/17181* (2013.01); *H01L 2224/48091* (2013.01); *H01L 2224/48227* (2013.01); *H01L 2224/73207* (2013.01); *H01L 2224/73257* (2013.01); *H01L 2224/73265* (2013.01); *H01L 2224/92127* (2013.01); *H01L 2225/0651* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); *H01L 2924/00014* (2013.01); *H01L 2924/01028* (2013.01); *H01L 2924/01046* (2013.01); *H01L 2924/01047* (2013.01); *H01L 2924/01079* (2013.01); *H01L 2924/05042* (2013.01); *H01L 2924/06* (2013.01); *H01L 2924/1033* (2013.01); *H01L 2924/10272* (2013.01); *H01L 2924/10329* (2013.01); *H01L 2924/10335* (2013.01); *H01L 2924/12036* (2013.01); *H01L 2924/1305* (2013.01); *H01L 2924/1306* (2013.01); *H01L 2924/13051* (2013.01)

(56) References Cited

U.S. PATENT DOCUMENTS

| | | |
|---|---|---|
| 7,791,204 B2 | 9/2010 | Hayashi et al. |
| 7,868,441 B2 | 1/2011 | Eaton et al. |
| 7,921,551 B2 | 4/2011 | Yamashita et al. |
| 7,989,269 B2 | 8/2011 | Do et al. |
| 8,018,066 B2 | 9/2011 | Hayashi et al. |
| 8,125,073 B2 | 2/2012 | Han et al. |
| 8,269,352 B2* | 9/2012 | Wang .................. H01L 23/3121 257/686 |
| 8,411,450 B2 | 4/2013 | Yamazaki et al. |
| 8,941,790 B2 | 1/2015 | Kimura et al. |
| 8,963,309 B2 | 2/2015 | Do et al. |
| 9,048,298 B1* | 6/2015 | Huemoeller .......... H01L 21/312 |
| 9,190,374 B2* | 11/2015 | Hua ....................... H01L 24/12 |
| 2003/0197281 A1* | 10/2003 | Farnworth .......... H01L 25/0657 257/777 |
| 2004/0036172 A1 | 2/2004 | Azuma et al. |
| 2006/0244128 A1 | 11/2006 | Hayashi et al. |
| 2007/0037321 A1 | 2/2007 | Higashino et al. |
| 2007/0278619 A1 | 12/2007 | Clevenger et al. |
| 2008/0284037 A1* | 11/2008 | Andry ................. H01L 21/6835 257/774 |
| 2009/0065904 A1* | 3/2009 | Wang ................ H01L 21/76898 257/621 |
| 2009/0223705 A1 | 9/2009 | Yamashita et al. |
| 2009/0230531 A1 | 9/2009 | Do et al. |
| 2010/0032808 A1* | 2/2010 | Ding ................... H01L 21/6835 257/621 |
| 2010/0044853 A1 | 2/2010 | Dekker et al. |
| 2010/0246144 A1 | 9/2010 | Yamazaki et al. |
| 2011/0084365 A1* | 4/2011 | Law ....................... H01L 24/05 257/621 |
| 2011/0183474 A1 | 7/2011 | Shigemura et al. |
| 2011/0266652 A1 | 11/2011 | Do et al. |
| 2011/0285930 A1 | 11/2011 | Kimura et al. |
| 2012/0018820 A1 | 1/2012 | Utsumi et al. |
| 2013/0175706 A1* | 7/2013 | Choi ..................... H01L 25/074 257/777 |
| 2014/0252602 A1 | 9/2014 | Hua et al. |

* cited by examiner

STACKED STRUCTURE OF
SEMICONDUCTOR CHIPS HAVING VIA
HOLES AND METAL BUMPS

CROSS-REFERENCE TO RELATED
DOCUMENTS

The present invention is a continuation in part (CIP) to a U.S. patent application Ser. No. 13/968,797 entitled "Structure of a Semiconductor Chip with Substrate Via Holes and Metal Bumps and a Fabrication Method Thereof" filed on Aug. 16, 2013.

FIELD OF THE INVENTION

The present invention relates to a stacked structure including at least one semiconductor chip with first substrate via holes and metal bumps, which can be used in the fabrication of the flip-chip bonded stacked chips, so that the integration of devices in a semiconductor chip can be improved, the chip size can be reduced, and the speed of signal transmission can be increased.

BACKGROUND OF THE INVENTION

In the fabrication process of a semiconductor device, in order to reduce the surface area of the semiconductor device, the flip-chip bonded stacked chips technology is developed, which uses copper bumps or solder bumps as bonding points between the bonded chips for signal transmission. FIG. 1A is a schematic showing the cross-sectional view of a semiconductor chip with copper bumps in a prior art, which comprises a substrate 101, a metal layer 103, a metal bump 105, and an electronic device 113. The electronic device 113 is formed on the front-side of the substrate 101. The metal layer 103 is formed on the front-side of the substrate 101 and connected to the electronic device 113. The metal bump 105 is formed on the metal layer 103. FIG. 1B is a schematic showing the cross-sectional view of flip-chip bonded stacked chips with copper bumps in a prior art, which is similar to the structure shown in FIG. 1A, except that an upper chip 135 is stacked on the metal bumps 105. The metal bumps 105 are connected to the upper chip 135. The electric signal from the electronic device 113 on the substrate 101 can be transmitted through the metal bumps 105 to the upper chip 135. A module substrate 133 is disposed under the substrate 101, and at least one bonding wire 137 is disposed on the module substrate 133. The electric signal from the electronic device 113 can be further transmitted through the bonding wire 137 to the module substrate 133.

Although the abovementioned design can form flip-chip bonded stacked chips, the density of the integration of the devices are limited, and thus the reduction of the chip size is restricted. The signal transmission speed can not be significantly increased, and therefore the electric power consumption of the circuit remains high. It is not possible to form more than two flip-chip bonded stacked chips.

To solve the abovementioned problems, the present invention provide a stacked structure including at least one semiconductor chip with substrate via holes and metal bumps to achieve heterogeneous integration, to improve the integration of the devices, to reduce the chip size, to increase the signal transmission speed, to lower the electric power consumption, and to reduce the material cost.

SUMMARY OF THE INVENTION

The main objectives of the present invention is to provide a stacked structure including at least one semiconductor chip with substrate via holes and metal bumps, so that the integration of the devices in the semiconductor chip can be improved, the chip size can be reduced, the signal transmission speed can be increased, the electric power consumption can be lowered, and heterogeneous integration can be achieved.

To reach the objectives stated above, the present invention provides a stacked structure, which comprises a first semiconductor chip, which includes: a first substrate having at least one first substrate via hole penetrating through said first substrate; at least one first backside metal layer formed on a backside of said first substrate and covering an inner surface of said at least one first substrate via hole and at least part of said backside of said first substrate; at least one first front-side metal layer formed on a front-side of said first substrate, wherein said at least one first front-side metal layer is electrically connected to said at least one first backside metal layer on a top of at least one of said at least one first substrate via hole; at least one first electronic device formed on said front-side of said first substrate, wherein at least one of said at least one first electronic device is electrically connected to said at least one first front-side metal layer; and at least one first metal bump formed on at least one of said at least one first backside metal layer and said at least one first front-side metal layer.

In implementation, further comprising a second semiconductor chip, which includes: a second substrate; at least one second front-side metal layer formed on a front-side of said second substrate; and at least one second electronic device formed on said front-side of said second substrate, wherein at least one of said at least one second electronic device is electrically connected to said at least one second front-side metal layer; wherein said second semiconductor chip is stacked on or below said first semiconductor chip, wherein said first semiconductor chip and said second semiconductor chip are electrically connected.

In implementation, said second semiconductor chip further comprises at least one second metal bump formed on said at least one second front-side metal layer, wherein said first semiconductor chip and said second semiconductor chip are electrically connected by at least one of said at least one first metal bump and said at least one second metal bump.

In implementation, said second semiconductor chip further comprises a second solder layer deposited on each of said at least one second metal bump, and wherein said second solder layer is made of In, Sn, In alloys, Sn alloys, or In—Sn alloys.

In implementation, said second substrate has at least one second substrate via hole penetrating through said second substrate, and wherein said second semiconductor chip further comprises at least one second backside metal layer formed on a backside of said second substrate and covering an inner surface of said at least one second substrate via hole and at least part of said backside of said second substrate, wherein said at least one second front-side metal layer is electrically connected to said at least one second backside metal layer on a top of at least one of said at least one second substrate via hole, wherein said at least one second metal bump is formed on at least one of said at least one second front-side metal layer and said at least one second backside metal layer.

In implementation, said second semiconductor chip further comprises a second passivation layer inserted between said front-side of said second substrate and said at least one second metal bump, wherein said second passivation layer covers at least part of said second substrate, said at least one second electronic device, and at least part of said at least one second front-side metal layer, and wherein at least part of said at least one second front-side metal layer is not covered by said second passivation layer.

In implementation, said second semiconductor chip further comprises a second redistribution layer inserted between said second passivation layer and said at least one second metal bump, and wherein said second redistribution layer is above said at least one second front-side metal layer, wherein said second redistribution layer comprises: at least one second dielectric layer formed above said second passivation layer and said at least one second front-side metal layer to cover at least part of said second substrate, said second passivation layer, and at least part of said at least one second front-side metal layer, wherein said at least one second dielectric layer has at least one second dielectric layer via hole penetrating through said at least one second dielectric layer; and at least one second extended front-side metal layer formed on said second dielectric layer to cover said at least one second dielectric layer via hole and at least part of said at least one second dielectric layer, wherein said at least one second extended front-side metal layer is electrically connected to said at least one second front-side metal layer, wherein said at least one second metal bump is formed on said at least one second extended front-side metal layer.

In implementation, further comprising a third semiconductor chip, which includes: a third substrate; at least one third front-side metal layer formed on a front-side of said third substrate; and at least one third electronic device formed on said front-side of said third substrate, wherein at least one of said at least one third electronic device is electrically connected to said at least one third front-side metal layer; wherein said third semiconductor chip is stacked below or stacked on and below said first semiconductor chip, wherein said first semiconductor chip and said third semiconductor chip are electrically connected.

In implementation, said third semiconductor chip further comprises at least one third metal bump formed on said at least one third front-side metal layer, wherein said first semiconductor chip and said third semiconductor chip are electrically connected by at least one of said at least one first metal bump and said at least one third metal bump.

In implementation, said third semiconductor chip further comprises a third solder layer deposited on each of said at least one third metal bump, and wherein said third solder layer is made of In, Sn, In alloys, Sn alloys, or In—Sn alloys.

In implementation, said third substrate has at least one third substrate via hole penetrating through said third substrate, and wherein said third semiconductor chip further comprises at least one third backside metal layer formed on a backside of said third substrate and covering an inner surface of said at least one third substrate via hole and at least part of said backside of said third substrate, wherein said at least one third front-side metal layer is electrically connected to said at least one third backside metal layer on a top of at least one of said at least one third substrate via hole, wherein said at least one third metal bump is formed on at least one of said at least one third front-side metal layer and said at least one third backside metal layer.

In implementation, said third semiconductor chip further comprises a third passivation layer inserted between said front-side of said third substrate and said at least one third metal bump, wherein said third passivation layer covers at least part of said third substrate, said at least one third electronic device, and at least part of said at least one third front-side metal layer, and wherein at least part of said at least one third front-side metal layer is not covered by said third passivation layer.

In implementation, said third semiconductor chip further comprises a third redistribution layer inserted between said third passivation layer and said at least one third metal bump, and wherein said third redistribution layer is above said at least one third front-side metal layer, wherein said third redistribution layer comprises: at least one third dielectric layer formed above said third passivation layer and said at least one third front-side metal layer to cover at least part of said third substrate, said third passivation layer, and at least part of said at least one third front-side metal layer, wherein said at least one third dielectric layer has at least one third dielectric layer via hole penetrating through said at least one third dielectric layer; and at least one third extended front-side metal layer formed on said third dielectric layer to cover said at least one third dielectric layer via hole and at least part of said at least one third dielectric layer, wherein said at least one third extended front-side metal layer is electrically connected to said at least one third front-side metal layer, wherein said at least one third metal bump is formed on said at least one third extended front-side metal layer.

In implementation, further comprising a third semiconductor chip, which includes: a third substrate; at least one third front-side metal layer formed on a front-side of said third substrate; and at least one third electronic device formed on said front-side of said third substrate, wherein at least one of said at least one third electronic device is electrically connected to said at least one third front-side metal layer; wherein said third semiconductor chip is stacked on or below said second semiconductor chip, wherein said second semiconductor chip and said third semiconductor chip are electrically connected.

In implementation, said third semiconductor chip further comprises at least one third metal bump formed on said at least one third front-side metal layer, wherein said second semiconductor chip and said third semiconductor chip are electrically connected by at least one of said at least one second metal bump and said at least one third metal bump.

In implementation, said third semiconductor chip further comprises a third solder layer deposited on each of said at least one third metal bump, and wherein said third solder layer is made of In, Sn, In alloys, Sn alloys, or In—Sn alloys.

In implementation, said third substrate has at least one third substrate via hole penetrating through said third substrate, and wherein said third semiconductor chip further comprises at least one third backside metal layer formed on a backside of said third substrate and covering an inner surface of said at least one third substrate via hole and at least part of said backside of said third substrate, wherein said at least one third front-side metal layer is electrically connected to said at least one third backside metal layer on a top of at least one of said at least one third substrate via hole, wherein said at least one third metal bump is formed on at least one of said at least one third front-side metal layer and said at least one third backside metal layer.

In implementation, said third semiconductor chip further comprises a third passivation layer inserted between said front-side of said third substrate and said at least one third metal bump, wherein said third passivation layer covers at least part of said third substrate, said at least one third electronic device, and at least part of said at least one third front-side metal layer, and wherein at least part of said at least one third front-side metal layer is not covered by said third passivation layer.

In implementation, said third semiconductor chip further comprises a third redistribution layer inserted between said third passivation layer and said at least one third metal bump, and wherein said third redistribution layer is above said at least one third front-side metal layer, wherein said third redistribution layer comprises: at least one third dielectric layer formed above said third passivation layer and said at least one third front-side metal layer to cover at least part of said third substrate, said third passivation layer, and at least part of said at least one third front-side metal layer, wherein said at least one third dielectric layer has at least one third dielectric layer via hole penetrating through said at least one third dielectric layer; and at least one third extended front-side metal layer formed on said third dielectric layer to cover said at least one third dielectric layer via hole and at least part of said at least one third dielectric layer, wherein said at least one third extended front-side metal layer is electrically connected to said at least one third front-side metal layer, wherein said at least one third metal bump is formed on said at least one third extended front-side metal layer.

In implementation, said first semiconductor chip further comprises a first passivation layer inserted between said front-side of said first substrate and said at least one first metal bump, wherein said first passivation layer covers at least part of said first substrate, said at least one first electronic device, and at least part of said at least one first front-side metal layer, and wherein at least part of said at least one first front-side metal layer is not covered by said first passivation layer.

In implementation, said first passivation layer is made of SiN.

In implementation, said first semiconductor chip further comprises a first redistribution layer inserted between said first passivation layer and said at least one first metal bump, and wherein said first redistribution layer is above said at least one first front-side metal layer, wherein said first redistribution layer comprises: at least one first dielectric layer formed above said first passivation layer and said at least one first front-side metal layer to cover at least part of said first substrate, said first passivation layer, and at least part of said at least one first front-side metal layer, wherein said at least one first dielectric layer has at least one first dielectric layer via hole penetrating through said at least one first dielectric layer; and at least one first extended front-side metal layer formed on said first dielectric layer to cover said at least one first dielectric layer via hole and at least part of said at least one first dielectric layer, wherein said at least one first extended front-side metal layer is electrically connected to said at least one first front-side metal layer, wherein said at least one first metal bump is formed on said at least one first extended front-side metal layer.

In implementation, said at least one first dielectric layer is made of dielectric material Polybenzoxazole (PBO).

In implementation, said at least one first front-side metal layer is made of Au, Cu, Au alloys or Cu alloys.

In implementation, said at least one first extended front-side metal layer is made of Au, Cu, Au alloys or Cu alloys.

In implementation, said first substrate is made of GaAs, SiC, GaN, GaN film on SiC or InP.

In implementation, said first semiconductor chip further comprises a first solder layer deposited on each of said at least one first metal bump, and wherein said first solder layer is made of In, Sn, In alloys, Sn alloys, or In—Sn alloys.

In implementation, a thickness of said first substrate is greater than 10 μm and smaller than 300 μm.

In implementation, said at least one first backside metal layer is made of Au, Cu, Pd, Ni, Ag, Ni alloys, Au alloys, Ni—Au alloys, Ni—Pd alloys, or Pd—Au alloys.

In implementation, said at least one first metal bump is made of Cu, Au or Cu alloys.

In implementation, said second passivation layer is made of SiN.

In implementation, said third passivation layer is made of SiN.

In implementation, said at least one second dielectric layer is made of dielectric material Polybenzoxazole (PBO).

In implementation, said at least one third dielectric layer is made of dielectric material Polybenzoxazole (PBO).

In implementation, said at least one second front-side metal layer is made of Au, Cu, Au alloys or Cu alloys.

In implementation, said at least one third front-side metal layer is made of Au, Cu, Au alloys or Cu alloys.

In implementation, said at least one second extended front-side metal layer is made of Au, Cu, Au alloys or Cu alloys.

In implementation, said at least one third extended front-side metal layer is made of Au, Cu, Au alloys or Cu alloys.

In implementation, said second substrate is made of GaAs, SiC, GaN, GaN film on SiC or InP.

In implementation, said third substrate is made of GaAs, SiC, GaN, GaN film on SiC or InP.

In implementation, a thickness of said second substrate is greater than 10 μm and smaller than 300 μm.

In implementation, a thickness of said third substrate is greater than 10 μm and smaller than 300 μm.

In implementation, said at least one second backside metal layer is made of Au, Cu, Pd, Ni, Ag, Ni alloys, Au alloys, Ni—Au alloys, Ni—Pd alloys, or Pd—Au alloys.

In implementation, said at least one third backside metal layer is made of Au, Cu, Pd, Ni, Ag, Ni alloys, Au alloys, Ni—Au alloys, Ni—Pd alloys, or Pd—Au alloys.

In implementation, said at least one second metal bump is made of Cu, Au or Cu alloys.

In implementation, said at least one third metal bump is made of Cu, Au or Cu alloys.

For further understanding the characteristics and effects of the present invention, some preferred embodiments referred to drawings are in detail described as follows.

DETAILED DESCRIPTIONS OR PREFERRED EMBODIMENTS

Figure 2A:
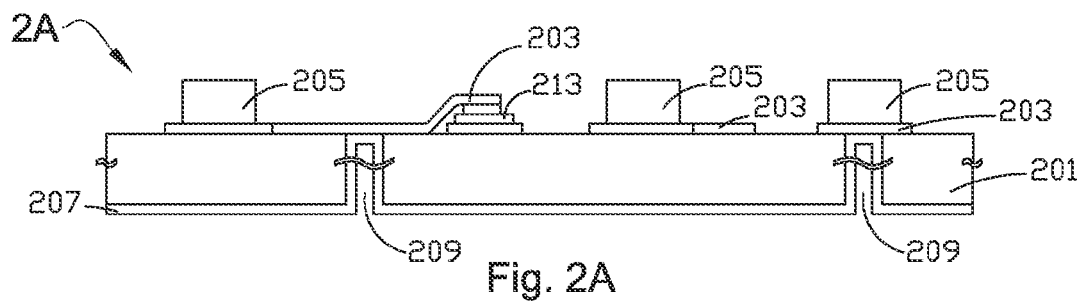
FIG. 2A~FIG. 2F are the schematics showing the cross-sectional view of the embodiments having a structure of a semiconductor chip with substrate via holes and metal bumps provided by the present invention.

FIG. 2A is a schematic showing the cross-sectional view of an embodiment of a structure of a semiconductor chip with substrate via holes and metal bumps according to the present invention. The structure comprises a substrate 201, which is made preferably of semiconductor materials GaAs, SiC, GaN, GaN film on SiC or InP, and the thickness of the substrate 201 is ranging from 10 μm to 300 μm. At least one electronic device 213 is formed on a front-side of the substrate 201. The at least one electronic device 213 is a field effect transistor (FET), a heterojunction bipolar transistor (HBT), a resistor, a capacitor, an inductor, or a combination of the above semiconductor electronic devices. At least one front-side metal layer 203 is formed on the front-side of the substrate 201. The at least one front-side metal layer 203 is made preferably of Au, Cu, Au alloys or Cu alloys, and the thickness of the at least one front-side metal layer 203 is equal to or larger than 3 μm. The at least one front-side metal layer 203 is electrically connected to at least one of the at least one electronic device 213. At least one metal bump 205 is formed on the at least one front-side metal layer 203. The at least one metal bump 205 is made preferably of Cu, Au or Cu alloys. At least one substrate via hole 209 is formed on a backside of the substrate 201 and penetrates through the substrate 201 by etching. At least one backside metal layer 207 is deposited on a backside of the substrate 201 to cover an inner surface of the at least one substrate via hole 209 and at least part of the backside of the substrate 201. The at least one backside metal layer 207 is made preferably of Au, Cu, Pd, Ni, Ag, Ni alloys, Au alloys, Ni—Au alloys, Ni—Pd alloys, or Pd—Au alloys. The at least one front-side metal layer 203 is electrically connected to the at least one backside metal layer 207 on a top of at least one of the at least one substrate via hole 209.

Figure 2B:
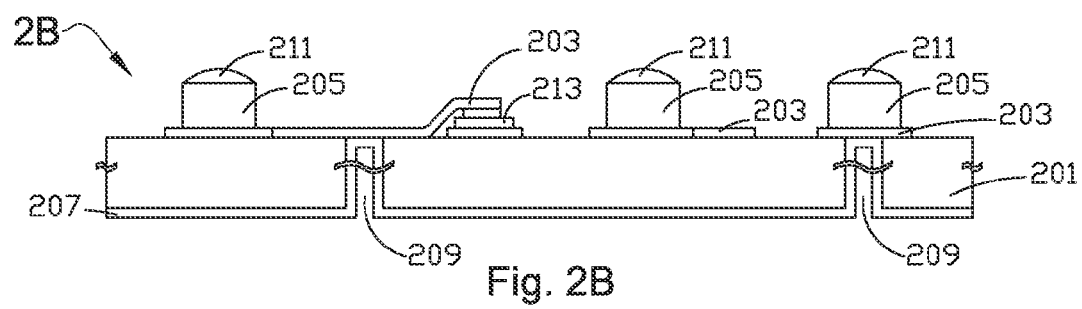

FIG. 2B is a schematic showing the cross-sectional view of another embodiment provided by the present invention. The structure is mostly similar to the structure shown in FIG. 2A, except that a solder layer 211 is deposited on each of the at least one metal bump 205. The solder layer 211 is made preferably of In, Sn, In alloys, Sn alloys, or In—Sn alloys.

Figure 2C:
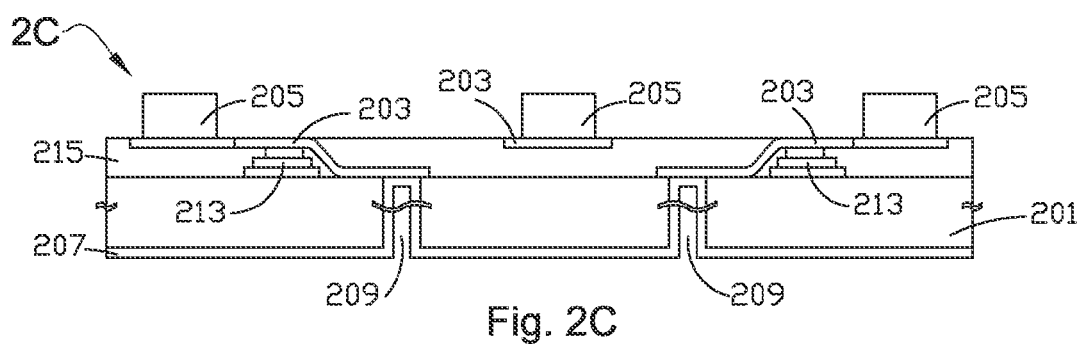

FIG. 2C is a schematic showing the cross-sectional view of another embodiment provided by the present invention. The structure is mostly similar to the structure shown in FIG. 2A, except that a passivation layer 215 is inserted between the front-side of the substrate 201 and the at least one metal bump 205 to cover at least part of the substrate 201, the at least one electronic device 213, and at least part of the at least one front-side metal layer 203, and wherein the at least one metal bump 205 and at least part of the at least one front-side metal layer 203 are not covered by the passivation layer 215. The passivation layer 215 is made preferably of SiN.

Figure 2D:
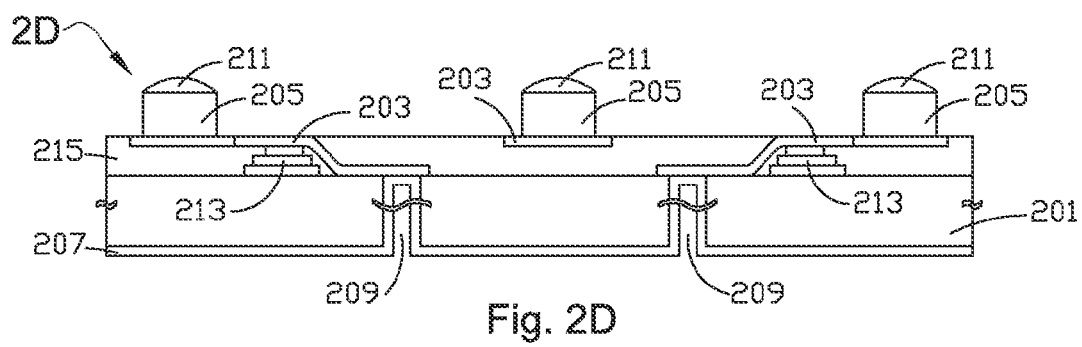

FIG. 2D is a schematic showing the cross-sectional view of another embodiment provided by the present invention. The structure is mostly similar to the structure shown in FIG. 2C, except that a solder layer 211 is deposited on each of the at least one metal bump 205. The solder layer 211 is made preferably of In, Sn, In alloys, Sn alloys, or In—Sn alloys.

Figure 2E:
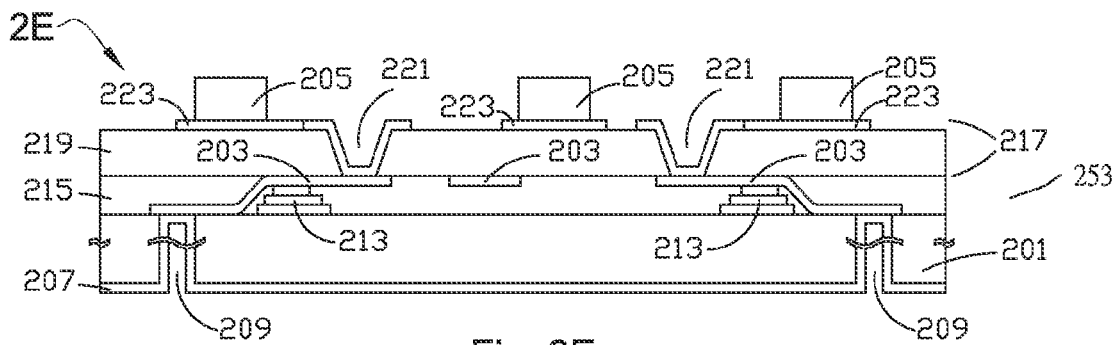

FIG. 2E is a schematic showing the cross-sectional view of another embodiment provided by the present invention. The structure is mostly similar to the structure shown in FIG. 2C, except that a redistribution layer 217 is inserted between the at least one metal bump 205 and the passivation layer 215, so that the redistribution layer 217 is located between the passivation layer 215 and the at least one metal bump 205, and the redistribution layer 217 is above the at least one front-side metal layer 203. The redistribution layer 217 comprises at least one dielectric layer 219 and at least one extended front-side metal layer 223. The at least one dielectric layer 219 is formed above the passivation layer 215 and the at least one front-side metal layer 203 to cover at least part of the substrate 201, the passivation layer 215, and at least part of the at least front-side metal layer 203. The dielectric layer 219 is made preferably of Polybenzoxazole (PBO), and the thickness of the dielectric layer 219 is ranging from 5 μm to 30 μm. The at least one dielectric layer 219 has at least one dielectric layer via hole 221 penetrating through the at least one dielectric layer 219. The at least one extended front-side metal layer 223 is formed on the dielectric layer 219 to cover the at least one dielectric layer via hole 221 and at least part of the at least one dielectric layer 219. The at least one extended front-side metal layer 223 is electrically connected to the at least one front-side metal layer 203 at the bottom of the dielectric via hole 221. The at least one extended front-side metal layer 223 is made preferably of Au, Cu, Au alloys, or Cu alloys. The at least one metal bump 205 is then formed on the at least one extended front-side metal layer 223. By the redistribution layer 217, the at least one metal bump 205 can be disposed on a suitable location. The electric signal can be transmitted through the backside metal layer 207, the at least one front-side metal layer 203, the at least one electronic device 213, the at least one extended front-side metal layer 223 and the at least one metal bump 205.

Figure 2F:
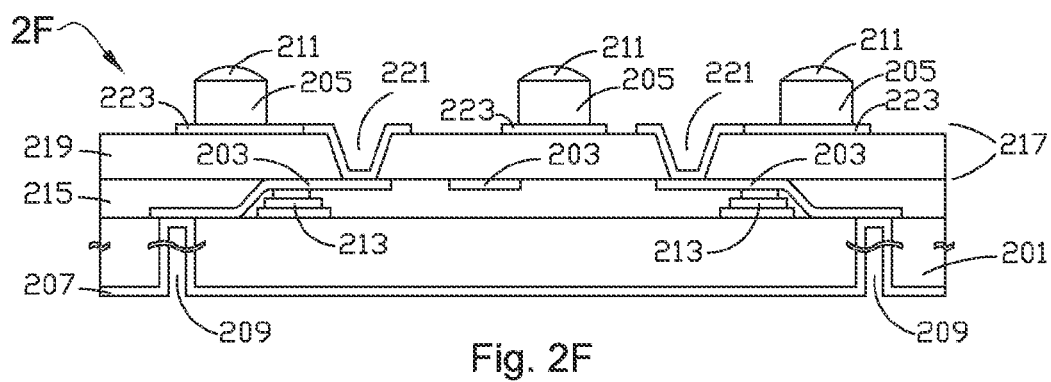

FIG. 2F is a schematic showing the cross-sectional view of another embodiment provided by the present invention. The structure is mostly similar to the structure shown in FIG. 2E, except that a solder layer 211 is deposited on each of the at least one metal bump 205. The solder layer 211 is made preferably of In, Sn, In alloys, Sn alloys, or In—Sn alloys.

Figure 3A:
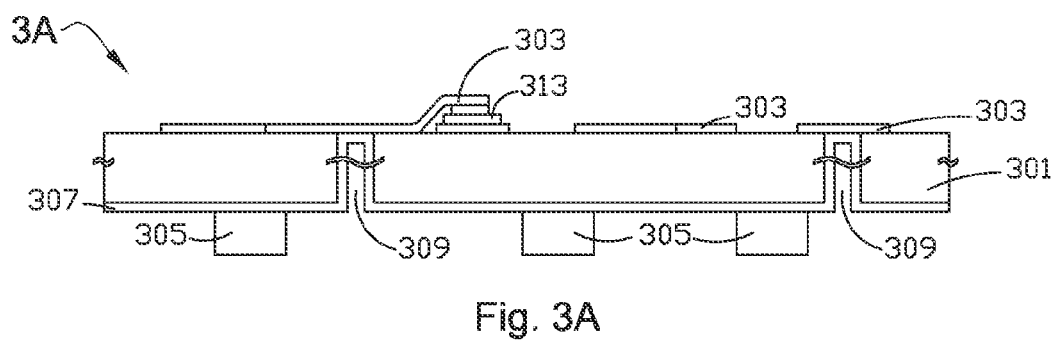
FIG. 3A~FIG. 3F are the schematics showing the cross-sectional view of the embodiments having a structure of a semiconductor chip with substrate via holes and metal bumps provided by the present invention.

FIG. 3A is a schematic showing the cross-sectional view of another embodiment of a structure of a semiconductor chip with substrate via holes and metal bumps according to the present invention. The structure comprises a substrate 301, which is made preferably of semiconductor materials GaAs, SiC, GaN, GaN film on SiC or InP, and the thickness of the substrate 301 is ranging from 10 µm to 300 µm. At least one electronic device 313 is formed on a front-side of the substrate 301. The at least one electronic device 313 is a field effect transistor (FET), a heterojunction bipolar transistor (HBT), a resistor, a capacitor, an inductor, or a combination of the above semiconductor electronic devices. At least one front-side metal layer 303 is formed on the front-side of the substrate 301. The at least one front-side metal layer 303 is made preferably of Au, Cu, Au alloys or Cu alloys, and the thickness of the at least one front-side metal layer 303 is equal to or larger than 3 µm. The at least one front-side metal layer 303 is electrically connected to at least one of the at least one electronic device 313. At least one substrate via hole 309 is formed on a backside of the substrate 301 and penetrates through the substrate 301 by etching. At least one backside metal layer 307 is deposited on a backside of the substrate 301 to cover an inner surface of the at least one substrate via hole 309 and at least part of the backside of the substrate 301. The at least one backside metal layer 307 is made preferably of Au, Cu, Pd, Ni, Ag, Ni alloys, Au alloys, Ni—Au alloys, Ni—Pd alloys, or Pd—Au alloys. The at least one front-side metal layer 303 is electrically connected to the at least one backside metal layer 307 on a top of at least one of the at least one substrate via hole 309. The structure shown in FIG. 3A is mostly similar to the structure shown in FIG. 2A, except that at least one metal bump 305 is formed on the at least one backside metal layer 307. The at least one metal bump 305 is made preferably of Cu, Au or Cu alloys.

Figure 3B:
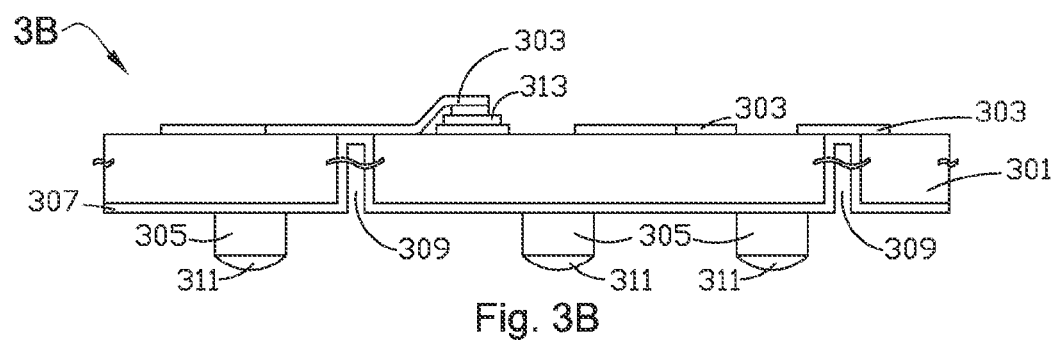

FIG. 3B is a schematic showing the cross-sectional view of another embodiment provided by the present invention. The structure is mostly similar to the structure shown in FIG. 3A, except that a solder layer 311 is deposited on each of the at least one metal bump 305. The solder layer 311 is made preferably of In, Sn, In alloys, Sn alloys, or In—Sn alloys.

Figure 3C:
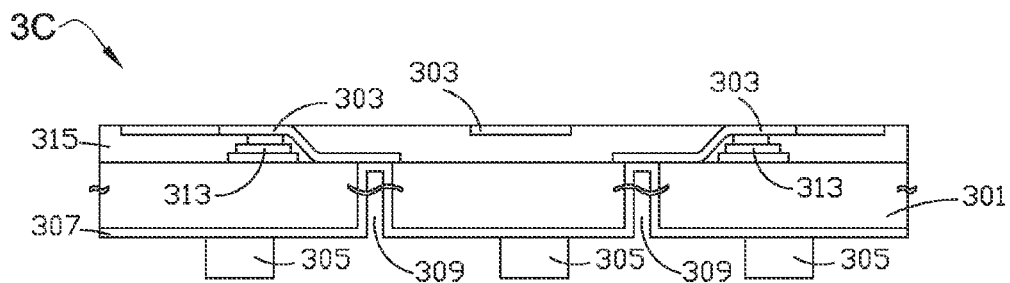

FIG. 3C is a schematic showing the cross-sectional view of another embodiment provided by the present invention. The structure is mostly similar to the structure shown in FIG. 3A, except that a passivation layer 315 is included on the front-side of the substrate 301 to cover at least part of the substrate 301, the at least one electronic device 313, and at least part of the at least one front-side metal layer 303, and wherein at least part of the at least one front-side metal layer 303 are not covered by the passivation layer 315. The passivation layer 315 is made preferably of SiN.

Figure 3D:
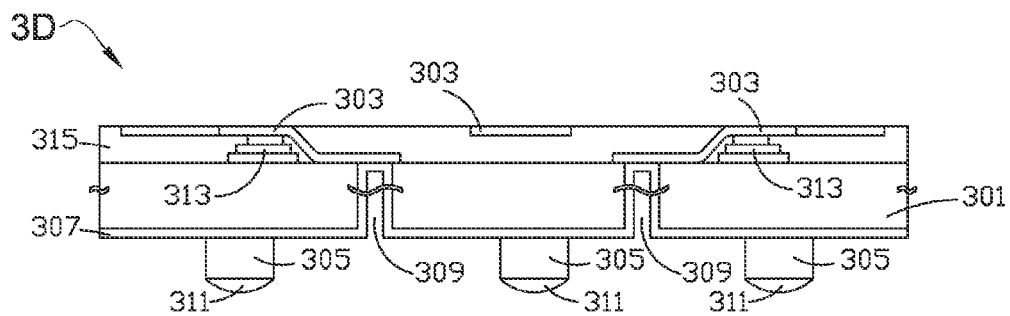

FIG. 3D is a schematic showing the cross-sectional view of another embodiment provided by the present invention. The structure is mostly similar to the structure shown in FIG. 3C, except that a solder layer 311 is deposited on each of the at least one metal bump 305. The solder layer 311 is made preferably of In, Sn, In alloys, Sn alloys, or In—Sn alloys.

Figure 3E:
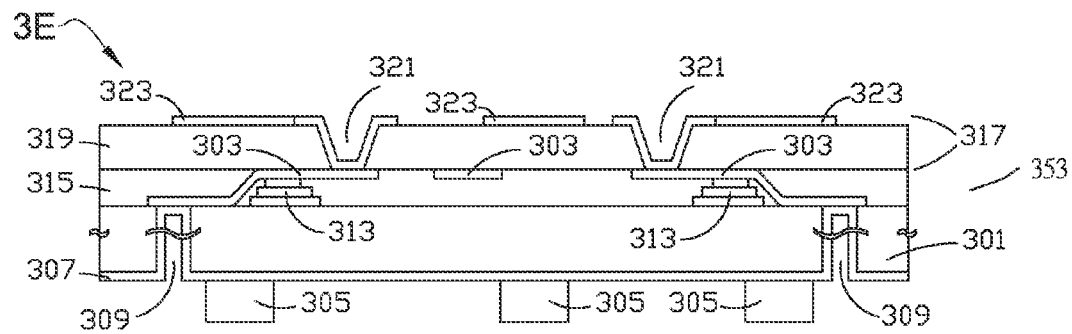

FIG. 3E is a schematic showing the cross-sectional view of another embodiment provided by the present invention. The structure is mostly similar to the structure shown in FIG. 3C, except that a redistribution layer 317 is included above the at least one front-side metal layer 303 and the passivation layer 315. The redistribution layer 317 comprises at least one dielectric layer 319 and at least one extended front-side metal layer 323. The at least one dielectric layer 319 is formed above the passivation layer 315 and the at least one front-side metal layer 303 to cover at least part of the substrate 301, the passivation layer 315, and at least part of the at least front-side metal layer 303. The dielectric layer 319 is made preferably of Polybenzoxazole (PBO), and the thickness of the dielectric layer 319 is ranging from 5 µm to 30 µm. The at least one dielectric layer 319 has at least one dielectric layer via hole 321 penetrating through the at least one dielectric layer 319. The at least one extended front-side metal layer 323 is formed on the dielectric layer 319 to cover the at least one dielectric layer via hole 321 and at least part of the at least one dielectric layer 319. The at least one extended front-side metal layer 323 is electrically connected to the at least one front-side metal layer 303 at the bottom of the dielectric via hole 321. The at least one extended front-side metal layer 323 is made preferably of Au, Cu, Au alloys, or Cu alloys. By the redistribution layer 317, the at least one metal bump 305 can be disposed on a suitable location. The electric signal can be transmitted through the at least one metal bump 305, the backside metal layer 307, the at least one front-side metal layer 303, the at least one electronic device 313 and the at least one extended front-side metal layer 323.

Figure 3F:
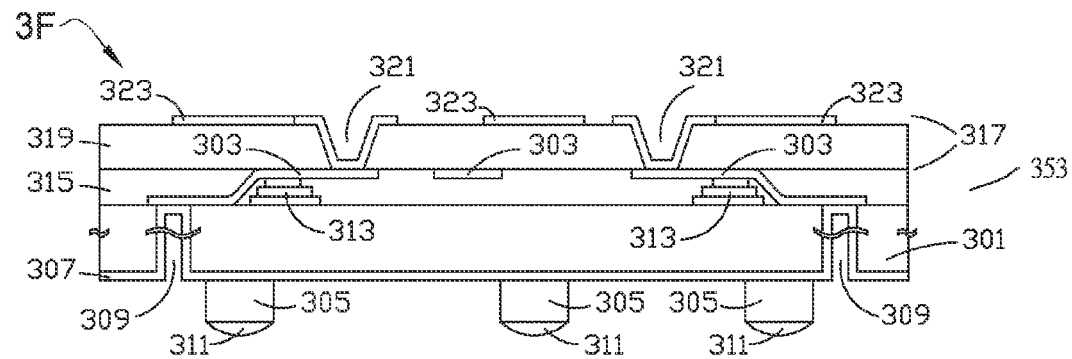

FIG. 3F is a schematic showing the cross-sectional view of another embodiment provided by the present invention. The structure is mostly similar to the structure shown in FIG. 3E, except that a solder layer 311 is deposited on each of the at least one metal bump 305. The solder layer 311 is made preferably of In, Sn, In alloys, Sn alloys, or In—Sn alloys.

Figure 4A:
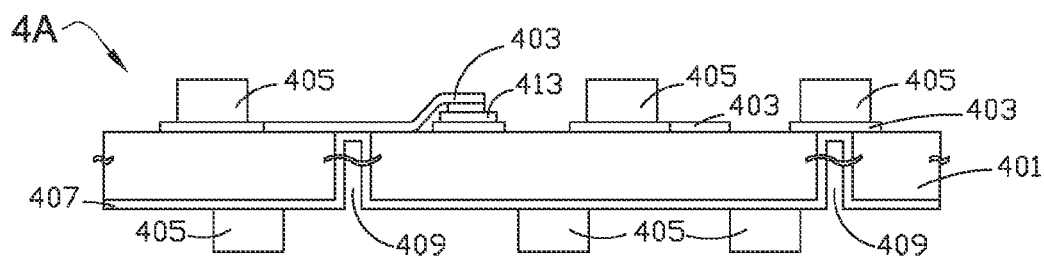
FIG. 4A~FIG. 4F are the schematics showing the cross-sectional view of the embodiments having a structure of a semiconductor chip with substrate via holes and metal bumps provided by the present invention.

FIG. 4A is a schematic showing the cross-sectional view of another embodiment of a structure of a semiconductor chip with substrate via holes and metal bumps according to the present invention. The structure comprises a substrate 401, which is made preferably of semiconductor materials GaAs, SiC, GaN, GaN film on SiC or InP, and the thickness of the substrate 401 is ranging from 10 µm to 300 µm. At least one electronic device 413 is formed on a front-side of the substrate 401. The at least one electronic device 413 is a field effect transistor (FET), a heterojunction bipolar transistor (HBT), a resistor, a capacitor, an inductor, or a combination of the above semiconductor electronic devices. At least one front-side metal layer 403 is formed on the front-side of the substrate 401. The at least one front-side metal layer 403 is made preferably of Au, Cu, Au alloys or Cu alloys, and the thickness of the at least one front-side metal layer 403 is equal to or larger than 3 µm. The at least one front-side metal layer 403 is electrically connected to at least one of the at least one electronic device 413. At least one substrate via hole 409 is formed on a backside of the substrate 401 and penetrates through the substrate 401 by etching. At least one backside metal layer 407 is deposited on a backside of the substrate 401 to cover an inner surface of the at least one substrate via hole 409 and at least part of the backside of the substrate 401. The at least one backside metal layer 407 is made preferably of Au, Cu, Pd, Ni, Ag, Ni alloys, Au alloys, Ni—Au alloys, Ni—Pd alloys, or Pd—Au alloys. The at least one front-side metal layer 403 is electrically connected to the at least one backside metal layer 407 on a top of at least one of the at least one substrate via hole 409. The structure is mostly similar to the structure shown in FIG. 2A and FIG. 3A, except that at least one metal bump 405 is formed on both the at least one front-side metal layer 403 and the at least one backside metal layer 407. The at least one metal bump 405 includes the at least one metal bump 405 formed on the front-side of the substrate 401 and the at least one metal bump 405 formed on the backside of the substrate 401. The at least one metal bump 405 is made preferably of Cu, Au or Cu alloys.

Figure 4B:
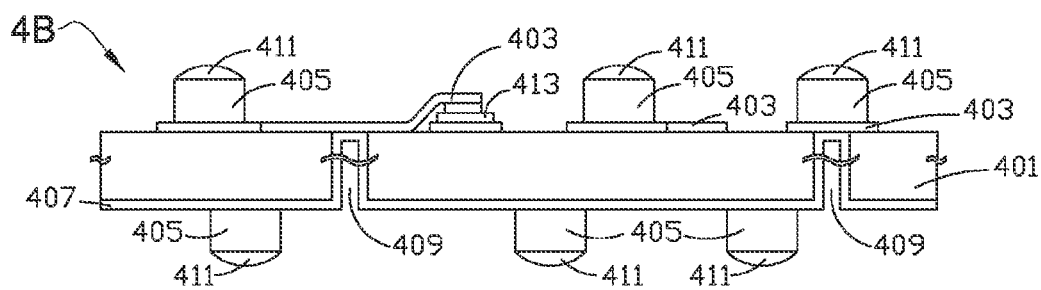

FIG. 4B is a schematic showing the cross-sectional view of another embodiment provided by the present invention. The structure is mostly similar to the structure shown in FIG. 4A, except that a solder layer 411 is deposited on each of the at least one metal bump 405. The solder layer 411 is made preferably of In, Sn, In alloys, Sn alloys, or In—Sn alloys.

Figure 4C:
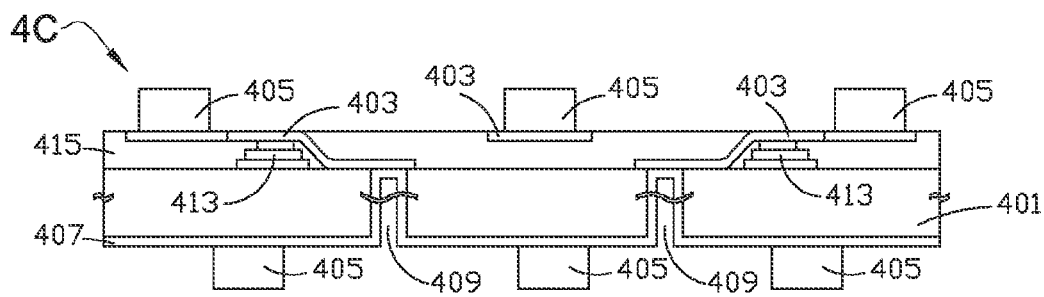

FIG. 4C is a schematic showing the cross-sectional view of another embodiment provided by the present invention. The structure is mostly similar to the structure shown in FIG. 4A, except that a passivation layer 415 is inserted between the front-side of the substrate 401 and the at least one metal bump 405 (formed on the front-side of the substrate 401) to cover at least part of the substrate 401, the at least one electronic device 413, and at least part of the at least one front-side metal layer 403, and wherein the at least one metal bump 405 (formed on the front-side of the substrate 401) and at least part of the at least one front-side metal layer 403 are not covered by the passivation layer 415. The passivation layer 415 is made preferably of SiN.

Figure 4D:
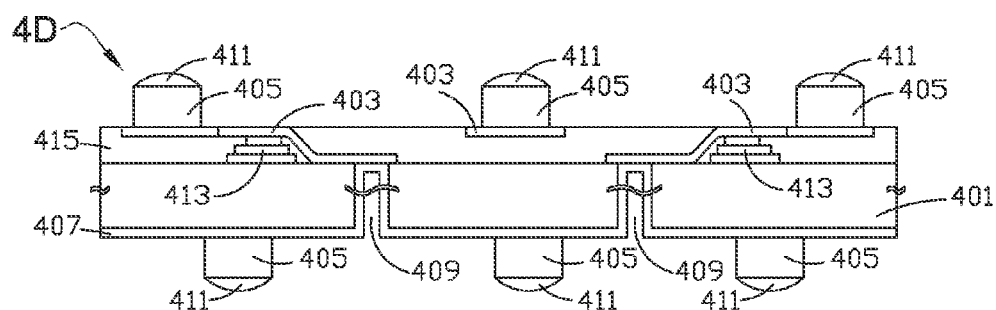

FIG. 4D is a schematic showing the cross-sectional view of another embodiment provided by the present invention. The structure is mostly similar to the structure shown in FIG. 4C, except that a solder layer 411 is deposited on each of the at least one metal bump 405. The solder layer 411 is made preferably of In, Sn, In alloys, Sn alloys, or In—Sn alloys.

Figure 4E:
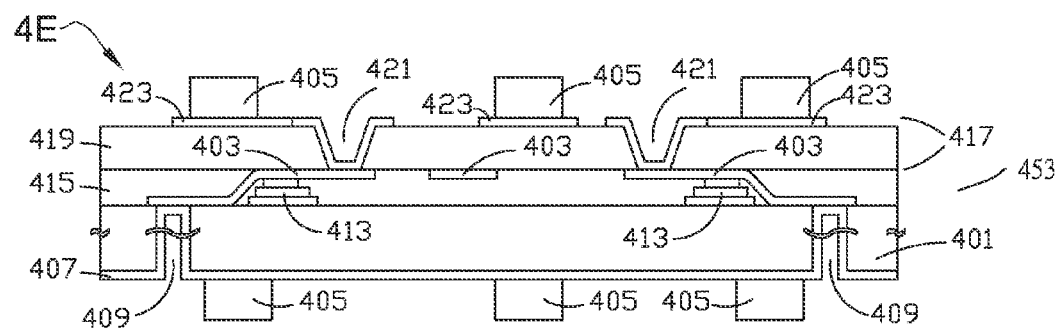

FIG. 4E is a schematic showing the cross-sectional view of another embodiment provided by the present invention. The structure is mostly similar to the structure shown in FIG. 4C, except that a redistribution layer 417 is inserted between the at least one metal bump 405 (formed on the front-side of the substrate 401) and the passivation layer 415, so that the redistribution layer 417 is located between the passivation layer 415 and the at least one metal bump 405 (formed on the front-side of the substrate 401), and the redistribution layer 417 is above the at least one front-side metal layer 403. The redistribution layer 417 comprises at least one dielectric layer 419 and at least one extended front-side metal layer 423. The at least one dielectric layer 419 is formed above the passivation layer 415 and the at least one front-side metal layer 403 to cover at least part of the substrate 401, the passivation layer 415, and at least part of the at least one front-side metal layer 403. The dielectric layer 419 is made preferably of Polybenzoxazole (PBO), and the thickness of the dielectric layer 419 is ranging from 5 μm to 30 μm. The at least one dielectric layer 419 has at least one dielectric layer via hole 421 penetrating through the at least one dielectric layer 419. The at least one extended front-side metal layer 423 is formed on the dielectric layer 419 to cover the at least one dielectric layer via hole 421 and at least part of the at least one dielectric layer 419. The at least one extended front-side metal layer 423 is electrically connected to the at least one front-side metal layer 403 at the bottom of the dielectric via hole 421. The at least one extended front-side metal layer 423 is made preferably of Au, Cu, Au alloys, or Cu alloys. The at least one metal bump 405 (formed on the front-side of the substrate 401) is then formed on the at least one extended front-side metal layer 423. By the redistribution layer 417, the at least one metal bump 405 can be disposed on a suitable location. The electric signal can be transmitted through the at least one metal bump 405 (formed on the backside of the substrate 401), the backside metal layer 407, the at least one front-side metal layer 403, the at least one electronic device 413, the at least one extended front-side metal layer 423 and the at least one metal bump 405 (formed on the front-side of the substrate 401).

Figure 4F:
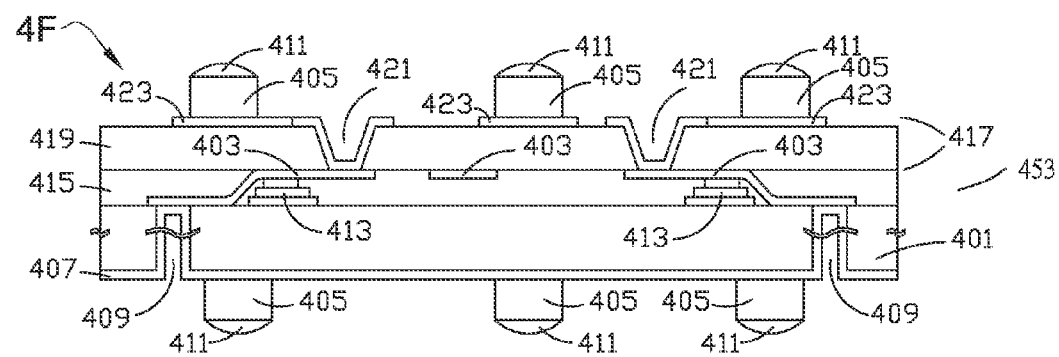

FIG. 4F is a schematic showing the cross-sectional view of another embodiment provided by the present invention. The structure is mostly similar to the structure shown in FIG. 4E, except that a solder layer 411 is deposited on each of the at least one metal bump 405. The solder layer 411 is made preferably of In, Sn, In alloys, Sn alloys, or In—Sn alloys.

Figure 5A:
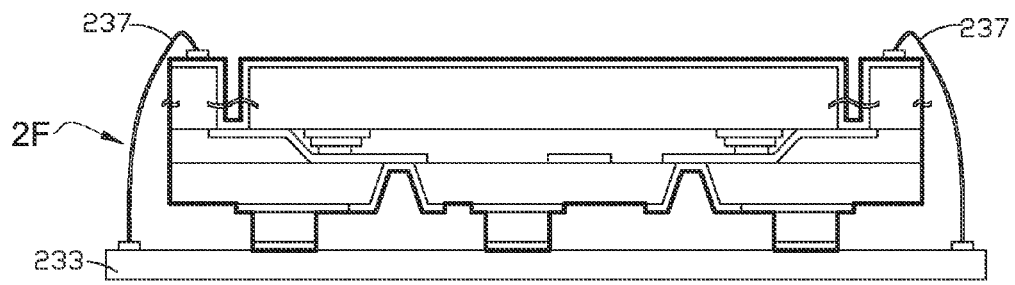
FIG. 5A and FIG. 5B are the schematics showing the cross-sectional view of the embodiments of a stacked structure including a semiconductor chip with substrate via holes and metal bumps provided by the present invention.

FIG. 5A is a schematic showing the cross-sectional view of a stacked structure including a semiconductor chip with substrate via holes and metal bumps provided by the present invention. A semiconductor chip 2F is the upside down of the embodiment shown in FIG. 2F. The front-side of the substrate 201 is facing downwards. A module substrate 233 is mounted with the at least one metal bump 205. The solder layer 211 is the adhesion for bonding the module substrate 233 and the at least one metal bump 205. At least one bonding wire 237 is disposed on the module substrate 233. The electric signal from the electronic device 213 can be transmitted through the bonding wire 237 to the module substrate 233.

Figure 5B:
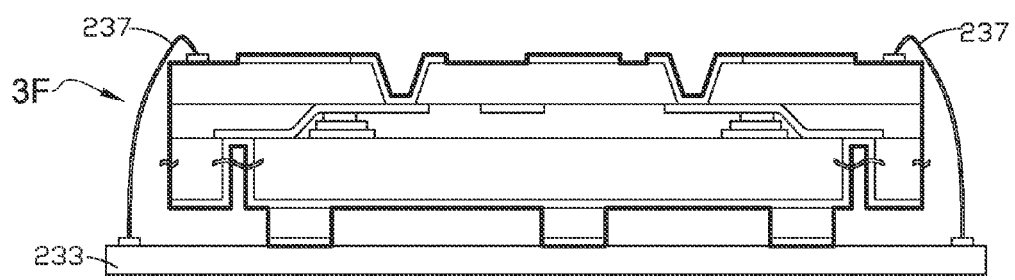

FIG. 5B is a schematic showing the cross-sectional view of another embodiment of a stacked structure including a semiconductor chip with substrate via holes and metal bumps provided by the present invention. The structure is mostly similar to the structure shown in FIG. 5A, except that the semiconductor chip 2F is replaced by a semiconductor chip 3F which is the embodiment shown in FIG. 3F. The front-side of the substrate 301 is facing upwards.

Figure 1A:
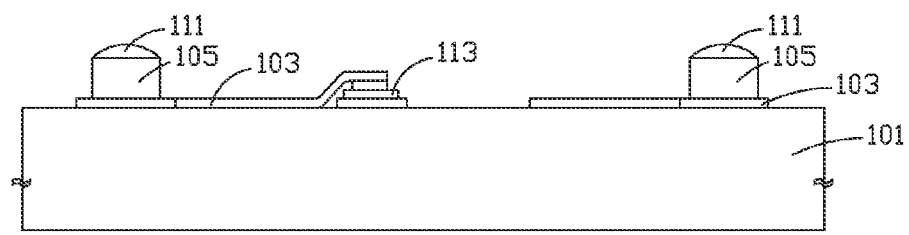
FIG. 1A is a schematic showing the cross-sectional view of a semiconductor chip with copper bumps in a prior art.
Figure 1B:
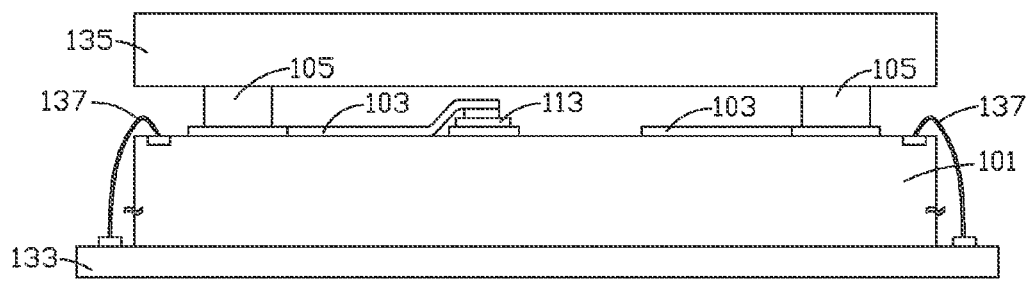
FIG. 1B is a schematic showing the cross-sectional view of flip-chip bonded stacked chips with copper bumps in a prior art.
Figure 1C:
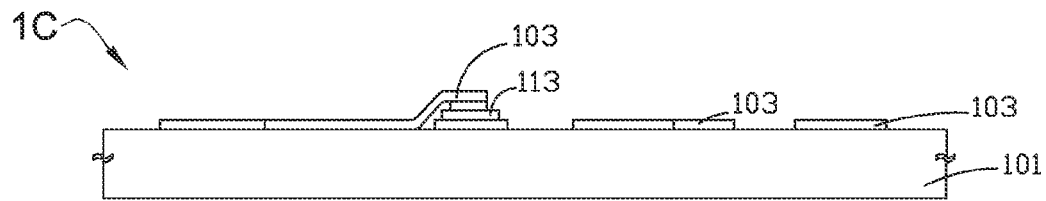
FIG. 1C~FIG. 1E are the schematics showing the cross-sectional view of the conventional technique.
Figure 1D:
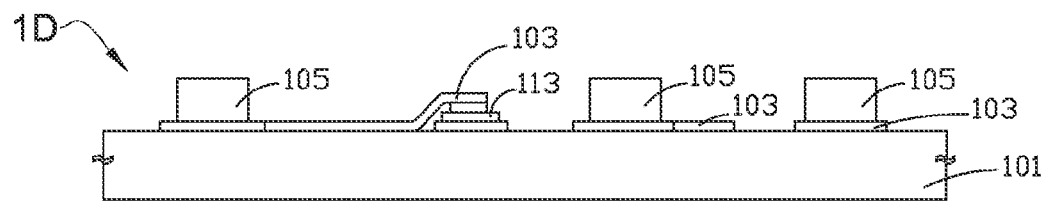
Figure 1E:
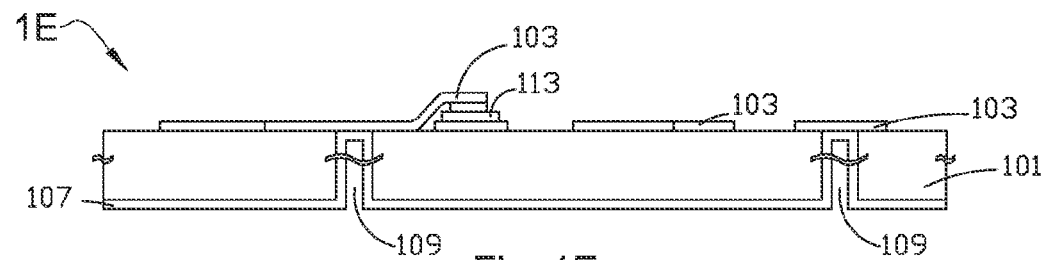

Please refer to FIG. 1C, FIG. 1D and FIG. 1E, which show the three types of semiconductor chip of the conventional technique. In FIG. 1C, the conventional semiconductor chip comprises a substrate 101, a metal layer 103, and an electronic device 113 (without via holes, bumps). In FIG. 1D, the conventional semiconductor chip comprises a substrate 101, a metal layer 103, a metal bump 105, and an electronic device 113 (without via holes). In FIG. 1E, the conventional semiconductor chip comprises a substrate 101, a metal layer 103, a via hole 109, a backside metal layer 107 and an electronic device 113 (without bumps).

Figure 6A:
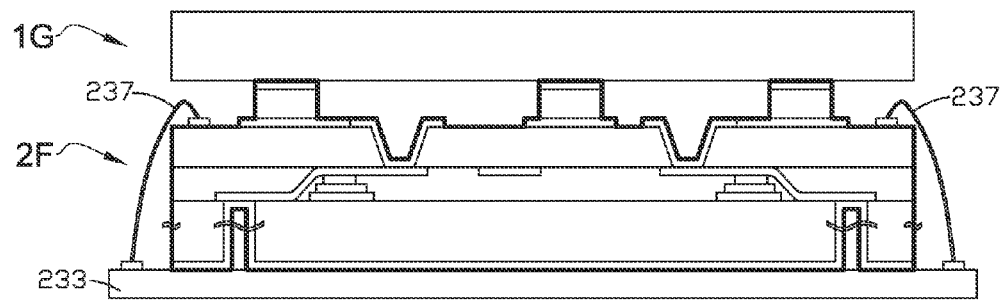
FIG. 6A~FIG. 6C are the schematics showing the cross-sectional view of the embodiments of a stacked structure including a semiconductor chip with substrate via holes and metal bumps provided by the present invention.

FIG. 6A is a schematic showing the cross-sectional view of an embodiment of a stacked structure including a semiconductor chip with substrate via holes and metal bumps provided by the present invention. A semiconductor chip 2F is the embodiment shown in FIG. 2F. The front-side of the substrate 201 is facing upwards. A module substrate 233 is mounted with the at least one backside metal layer 207. At least one bonding wire 237 is disposed on the module substrate 233. The electric signal from the electronic device 213 can be transmitted through the bonding wire 237 to the module substrate 233. A semiconductor chip 1G is stacked on the at least one metal bump 205 of the semiconductor chip 2F. The solder layer 211 is the adhesion for bonding the semiconductor chip 1G and the at least one metal bump 205. The semiconductor chip 1G may be any one of the semiconductor chip shown in FIG. 1C, FIG. 1D, FIG. 1E, FIG. 2A~FIG. 2F, FIG. 3A~FIG. 3F, and FIG. 4A~FIG. 4F.

Figure 6B:
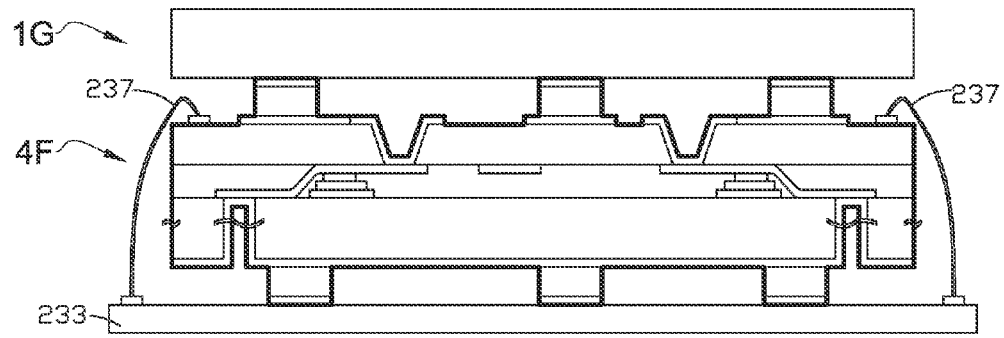

FIG. 6B is a schematic showing the cross-sectional view of another embodiment of a stacked structure including a semiconductor chip with substrate via holes and metal bumps provided by the present invention. The structure is mostly similar to the structure shown in FIG. 6A, except that the semiconductor chip 2F is replaced by a semiconductor chip 4F which is the embodiment shown in FIG. 4F. The front-side of the substrate 401 is facing upwards. The module substrate 233 is mounted with the at least one metal bump 405 (formed on the backside of the substrate 401). The solder layer 411 is the adhesion for bonding the module substrate 233 and the at least one metal bump 405 (formed on the backside of the substrate 401).

Figure 6C:
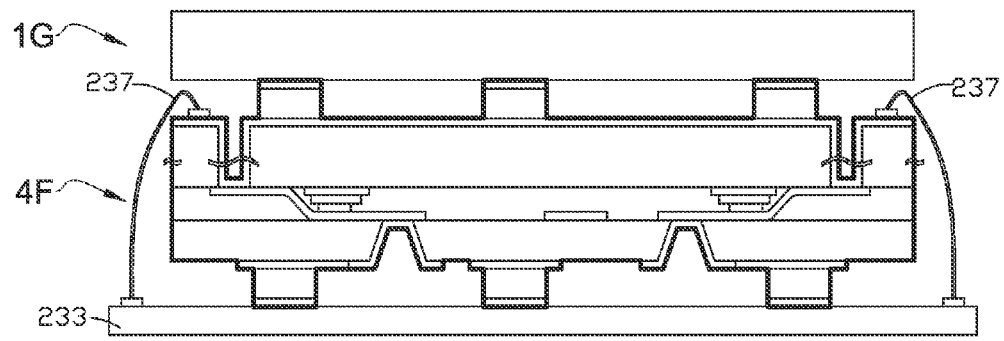

FIG. 6C is a schematic showing the cross-sectional view of another embodiment of a stacked structure including a semiconductor chip with substrate via holes and metal bumps provided by the present invention. The structure is mostly similar to the structure shown in FIG. 6B, except that the semiconductor chip 4F is replaced by the upside down of semiconductor chip 4F. The front-side of the substrate 401 is facing downwards.

Figure 6D:
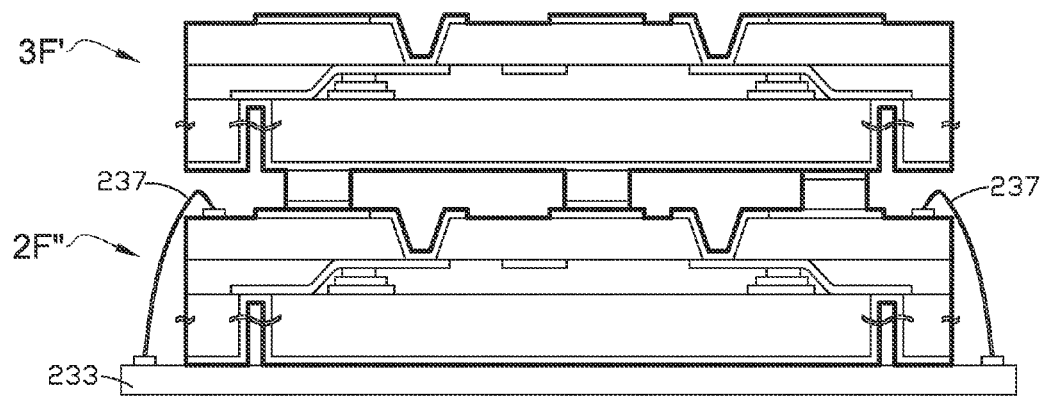
FIG. 6D~FIG. 6M are the schematics showing the cross-sectional view of the embodiments of a stacked structure including two semiconductor chips with substrate via holes and metal bumps provided by the present invention.

FIG. 6D is a schematic showing the cross-sectional view of another embodiment of a stacked structure including two semiconductor chips with substrate via holes and metal bumps provided by the present invention. The structure of a semiconductor chip 2F" is mostly similar to the structure shown in FIG. 2F, except that the structure shown in FIG. 2F has three at least one metal bumps 205 while the structure of the semiconductor chip 2F" has only one at least one metal bump 205 on the right hand side. The front-side of the substrate 201 is facing upwards. A module substrate 233 is mounted with the at least one backside metal layer 207. At least one bonding wire 237 is disposed on the module substrate 233. The electric signal from the electronic device 213 can be transmitted through the bonding wire 237 to the module substrate 233. The structure of a semiconductor chip 3F' is mostly similar to the structure shown in FIG. 3F, except that the structure shown in FIG. 3F has three at least one metal bumps 305 while the structure of the semiconductor chip 3F' has two at least one metal bumps 305 on the left hand side of the bottom. The front-side of the substrate 301 is facing upwards. The semiconductor chip 3F' is stacked on the semiconductor chip 2F" by the one at least one metal bump 205 and the two at least one metal bumps 305. The solder layer 211 is the adhesion for bonding the semiconductor chip 3F' and the one at least one metal bump 205. The solder layer 311 is the adhesion for bonding the semiconductor chip 2F" and the two at least one metal bumps 305.

Figure 6E:
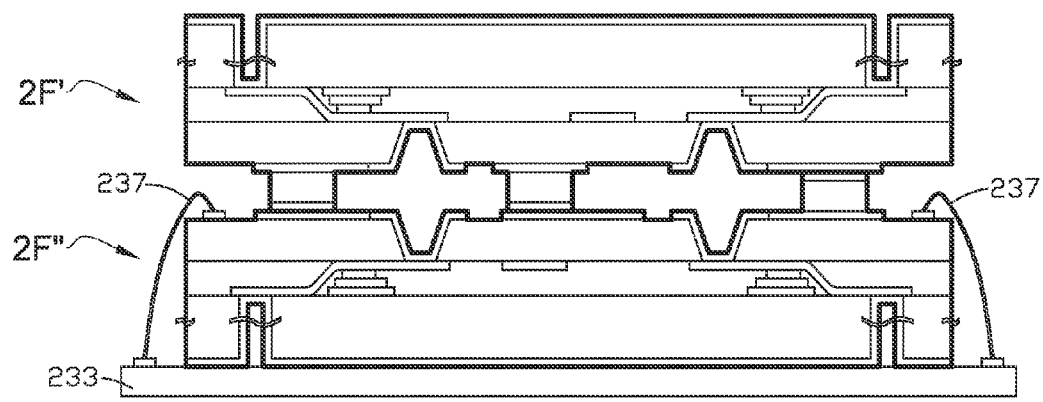

FIG. 6E is a schematic showing the cross-sectional view of another embodiment of a stacked structure including two semiconductor chips with substrate via holes and metal bumps provided by the present invention. The structure is mostly similar to the structure shown in FIG. 6D, except that the semiconductor chip 3F' is replaced by a semiconductor chip 2F'. The structure of the semiconductor chip 2F' is mostly similar to the upside down of the structure shown in FIG. 2F, except that the structure shown in FIG. 2F has three at least one metal bumps 205 while the structure of the semiconductor chip 2F' has two at least one metal bumps 205. The front-side of the substrate 201 of the semiconductor chip 2F' is facing downwards.

Figure 6F:
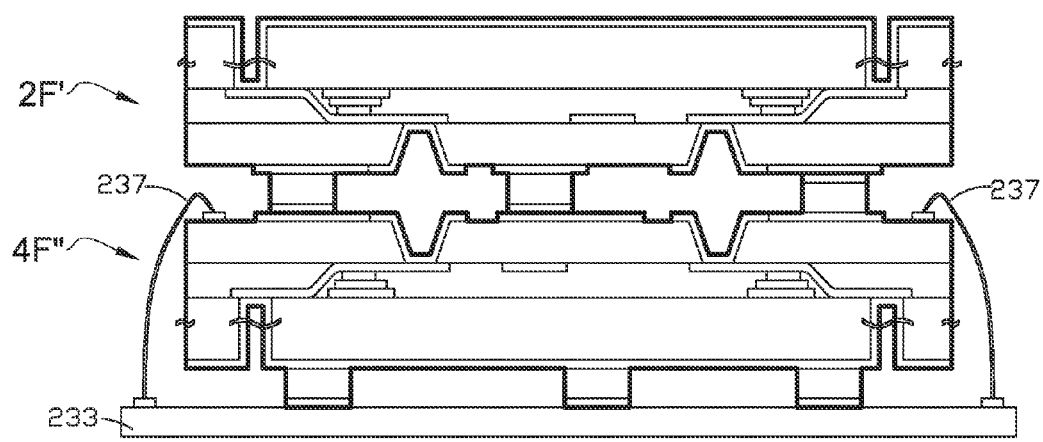

FIG. 6F is a schematic showing the cross-sectional view of another embodiment of a stacked structure including two semiconductor chips with substrate via holes and metal bumps provided by the present invention. The structure is mostly similar to the structure shown in FIG. 6E, except that the semiconductor chip 2F" is replaced by a semiconductor chip 4F‴. The structure of the semiconductor chip 4F″ is mostly similar to the structure shown in FIG. 4F, except that the structure shown in FIG. 4F has three at least one metal bumps 405 formed on the front-side of the substrate 401 while the structure of the semiconductor chip 4F″ has only one at least one metal bump 405 formed on the front-side of the substrate 401. The module substrate 233 is mounted with the at least one metal bump 405 (formed on the backside of the substrate 401). The solder layer 411 is the adhesion for bonding the module substrate 233 and the at least one metal bump 405 (formed on the backside of the substrate 401).

Figure 6G:
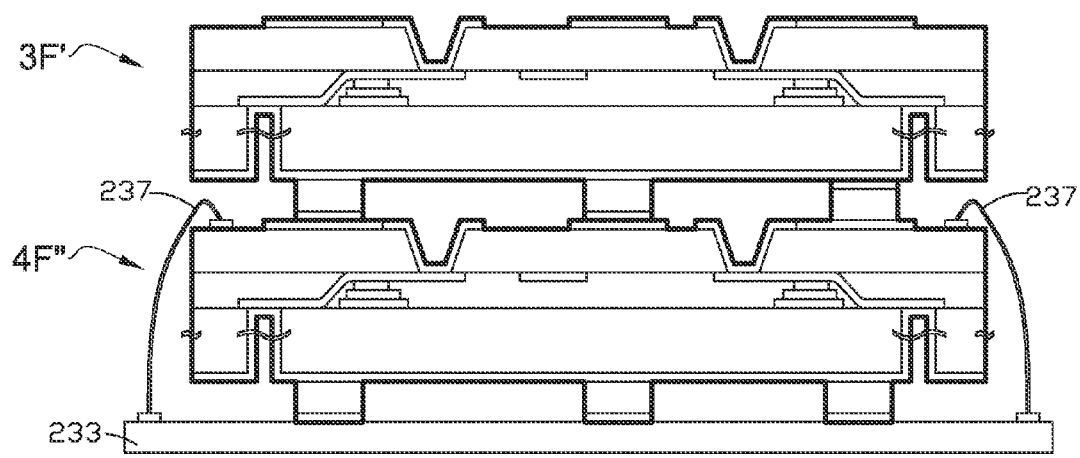

FIG. 6G is a schematic showing the cross-sectional view of another embodiment of a stacked structure including two semiconductor chips with substrate via holes and metal bumps provided by the present invention. The structure is mostly similar to the structure shown in FIG. 6F, except that the semiconductor chip 2F' is replaced by a semiconductor chip 3F'. The semiconductor chip 3F' is stacked on the semiconductor chip 4F‴ by one at least one metal bump 405 and two at least one metal bumps 305. The solder layer 411 is the adhesion for bonding the semiconductor chip 3F' and the one at least one metal bump 405 (formed on the front-side of the substrate 401). The solder layer 311 is the adhesion for bonding the semiconductor chip 4F‴ and the two at least one metal bumps 305.

Figure 6H:
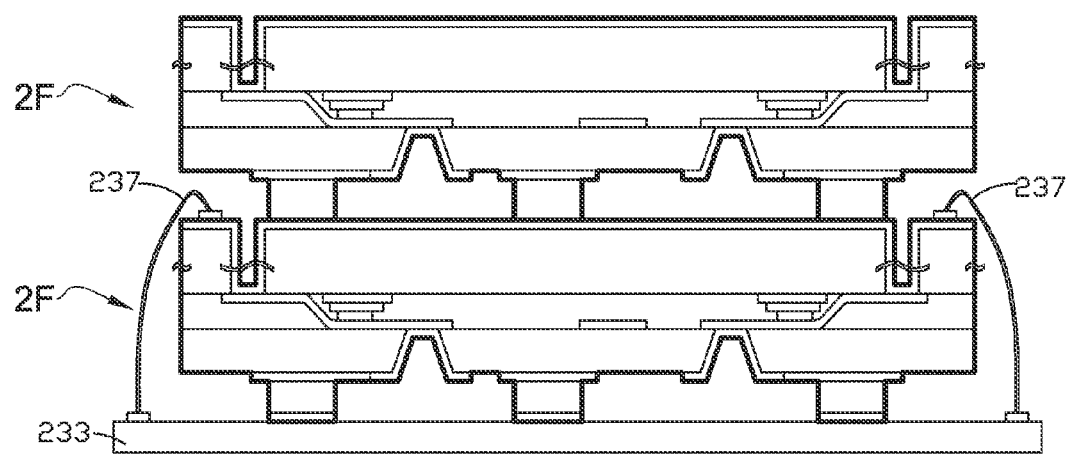

FIG. 6H is a schematic showing the cross-sectional view of another embodiment of a stacked structure including two semiconductor chips with substrate via holes and metal bumps provided by the present invention. The structure is mostly similar to the structure shown in FIG. 5A, except that the structure further comprises a semiconductor chip 2F (which is the upside down of the structure shown in FIG. 2F) stacked on the structure shown in FIG. 5A. The solder layer 211 of the "upper" semiconductor chip 2F is the adhesion for bonding the "lower" semiconductor chip 2F and the one at least one metal bump 205 of the "upper" semiconductor chip 2F.

Figure 6I:
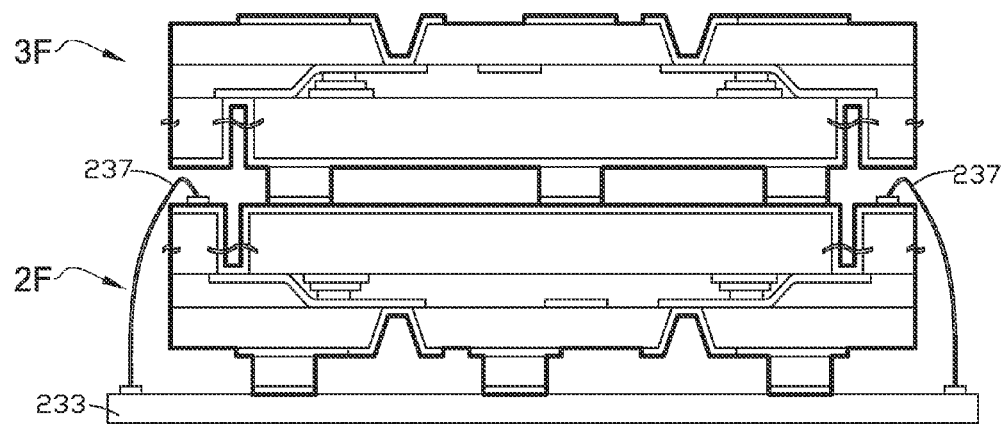

FIG. 6I is a schematic showing the cross-sectional view of another embodiment of a stacked structure including two semiconductor chips with substrate via holes and metal bumps provided by the present invention. The structure is mostly similar to the structure shown in FIG. 6H, except that the "upper" semiconductor chip 2F is replaced by a semiconductor chip 3F.

Figure 6J:
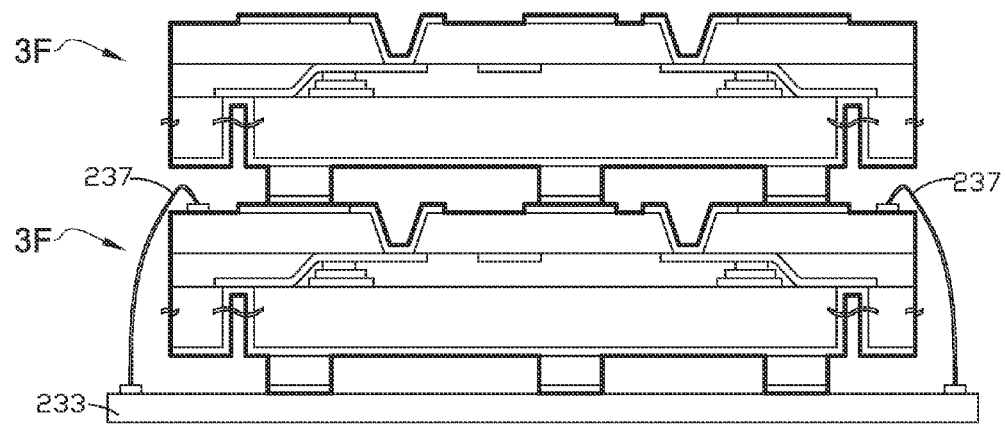

FIG. 6J is a schematic showing the cross-sectional view of another embodiment of a stacked structure including two semiconductor chips with substrate via holes and metal bumps provided by the present invention. The structure is mostly similar to the structure shown in FIG. 6I, except that the semiconductor chip 2F is replaced by a semiconductor chip 3F.

Figure 6K:
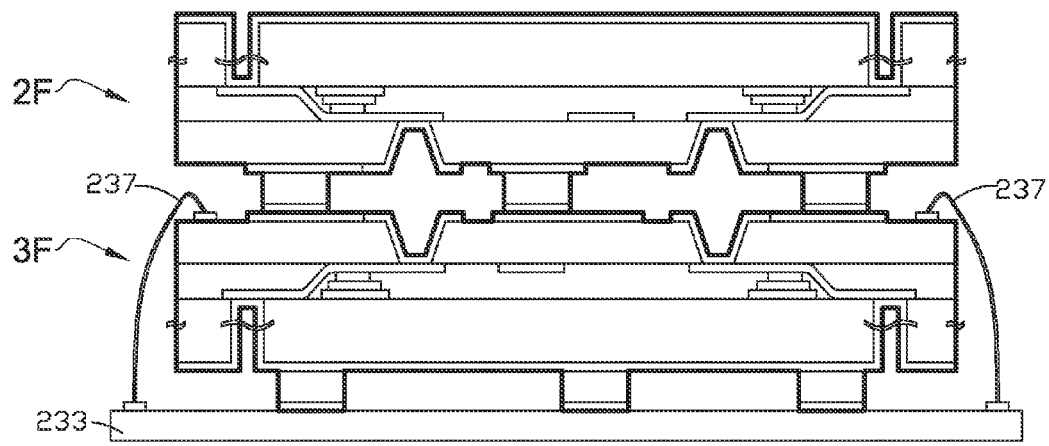

FIG. 6K is a schematic showing the cross-sectional view of another embodiment of a stacked structure including two semiconductor chips with substrate via holes and metal bumps provided by the present invention. The structure is mostly similar to the structure shown in FIG. 6H, except that the "lower" semiconductor chip 2F is replaced by a semiconductor chip 3F.

Figure 6L:
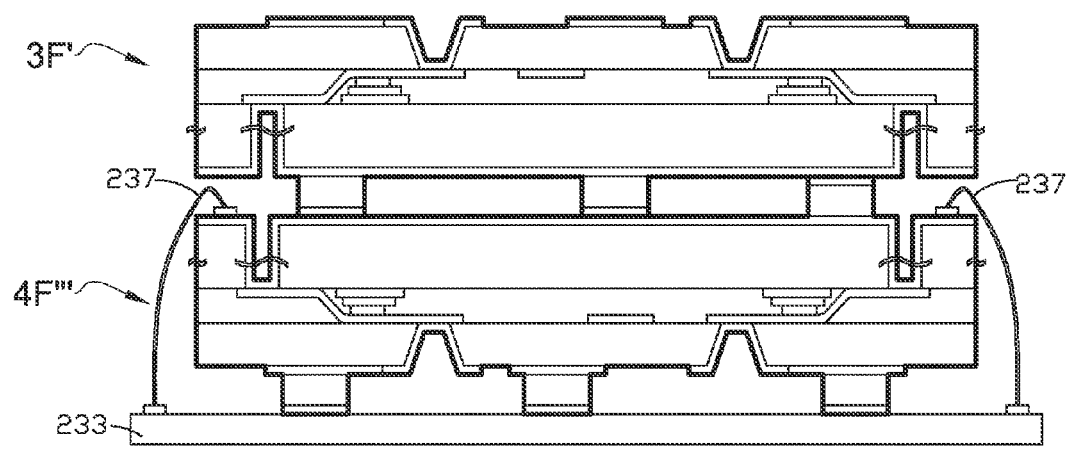

FIG. 6L is a schematic showing the cross-sectional view of another embodiment of a stacked structure including two semiconductor chips with substrate via holes and metal bumps provided by the present invention. The structure is mostly similar to the structure shown in FIG. 6G, except that the semiconductor chip 4F″ is replaced by a semiconductor chip 4F‴. The structure of the semiconductor chip 4F‴ is mostly similar to the upside down of the structure shown in FIG. 4F, except that the structure shown in FIG. 4F has three at least one metal bumps 405 formed on the backside of the substrate 401 while the structure of the semiconductor chip 4F‴ has only one at least one metal bump 405 formed on the backside of the substrate 401.

Figure 6M:
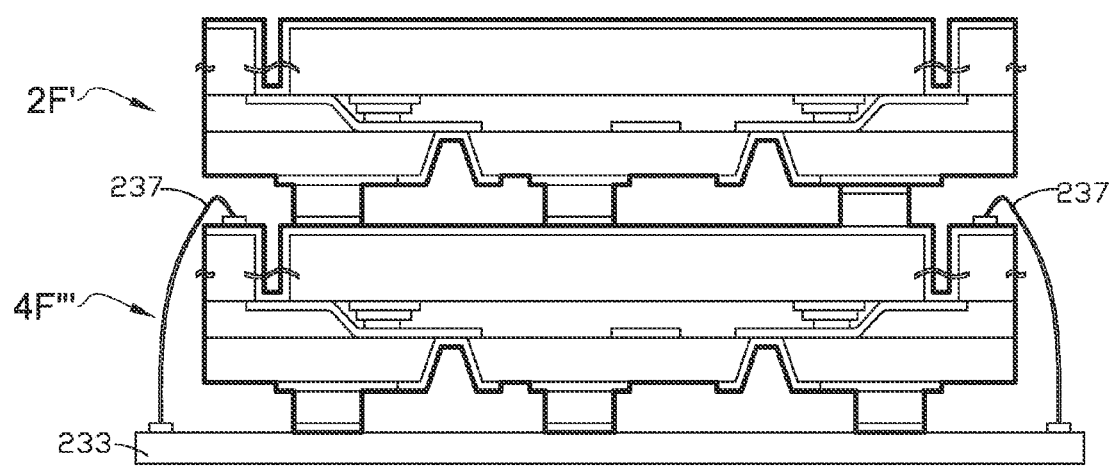

FIG. 6M is a schematic showing the cross-sectional view of another embodiment of a stacked structure including two semiconductor chips with substrate via holes and metal bumps provided by the present invention. The structure is mostly similar to the structure shown in FIG. 6L, except that the semiconductor chip 3F' is replaced by a semiconductor chip 2F'.

Figure 7A:
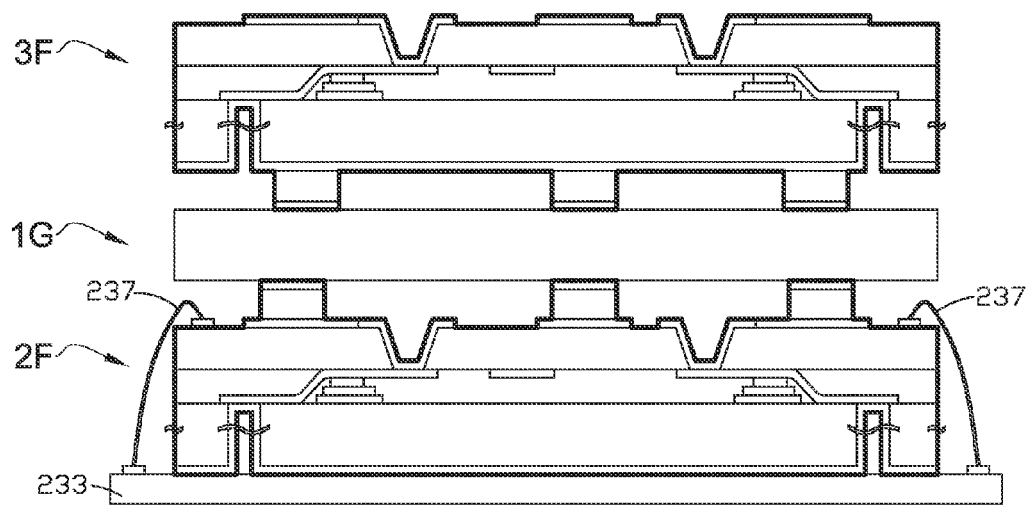
FIG. 7A~FIG. 7F are the schematics showing the cross-sectional view of the embodiments of a stacked structure including two semiconductor chips with substrate via holes and metal bumps provided by the present invention.

FIG. 7A is a schematic showing the cross-sectional view of an embodiment of a stacked structure including two semiconductor chips with substrate via holes and metal bumps provided by the present invention. The structure is mostly similar to the structure shown in FIG. 6A, except that the structure further comprises a semiconductor chip 3F stacked on the structure shown in FIG. 6A. The semiconductor chip 1G may be any one of the semiconductor chip shown in FIG. 1E, FIG. 2A~FIG. 2F, FIG. 3A~FIG. 3F, and FIG. 4A~FIG. 4F.

Figure 7B:
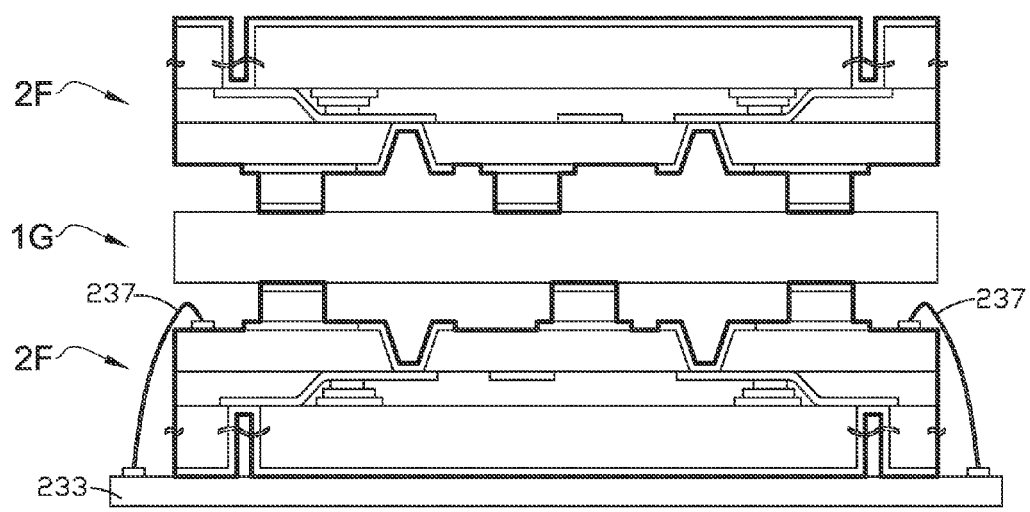

FIG. 7B is a schematic showing the cross-sectional view of another embodiment of a stacked structure including two semiconductor chips with substrate via holes and metal bumps provided by the present invention. The structure is mostly similar to the structure shown in FIG. 7A, except that the semiconductor chip 3F is replaced by a semiconductor chip 2F.

Figure 7C:
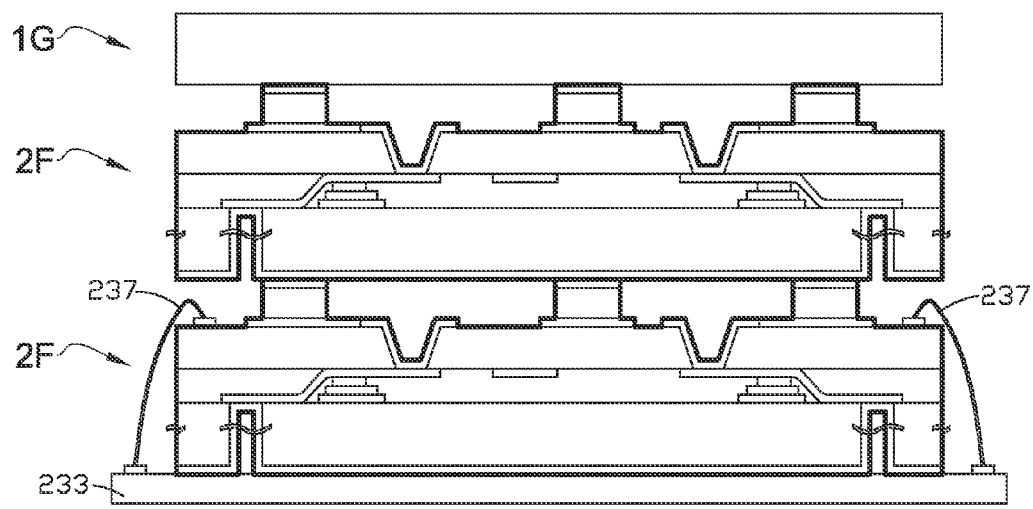

FIG. 7C is a schematic showing the cross-sectional view of an embodiment of a stacked structure including two semiconductor chips with substrate via holes and metal bumps provided by the present invention. The structure is mostly similar to the structure shown in FIG. 6A, except that the structure further comprises an "upper" semiconductor chip 2F inserted in between the "lower" semiconductor chip 2F and the semiconductor chip 1G. The semiconductor chip 1G may be any one of the semiconductor chip shown in FIG. 1C, FIG. 1D, FIG. 1E, FIG. 2A~FIG. 2F, FIG. 3A~FIG. 3F, and FIG. 4A~FIG. 4F.

Figure 7D:
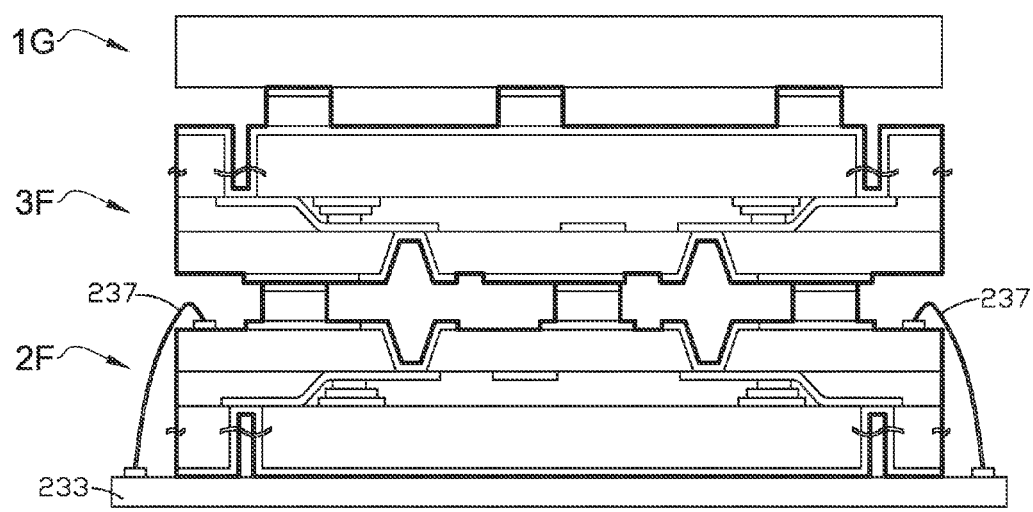

FIG. 7D is a schematic showing the cross-sectional view of another embodiment of a stacked structure including two semiconductor chips with substrate via holes and metal bumps provided by the present invention. The structure is mostly similar to the structure shown in FIG. 7C, except that the "upper" semiconductor chip 2F is replaced by a semiconductor chip 3F.

Figure 7E:
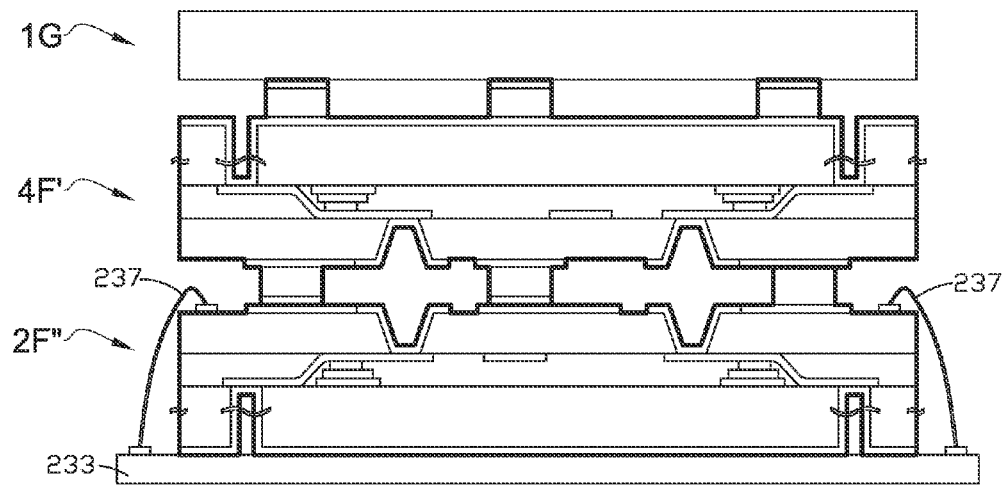

FIG. 7E is a schematic showing the cross-sectional view of another embodiment of a stacked structure including two semiconductor chips with substrate via holes and metal bumps provided by the present invention. The structure of a semiconductor chip 2F" is mostly similar to the structure shown in FIG. 2F, except that the structure shown in FIG. 2F has three at least one metal bumps 205 while the structure of the semiconductor chip 2F" has only one at least one metal bump 205 on the right hand side. The front-side of the substrate 201 is facing upwards. A module substrate 233 is mounted with the at least one backside metal layer 207. At least one bonding wire 237 is disposed on the module substrate 233. The structure of a semiconductor chip 4F' is mostly similar to the upside down of the structure shown in FIG. 4F, except that the structure shown in FIG. 4F has three at least one metal bumps 405 formed on the front-side of the substrate 401 while the structure of the semiconductor chip 4F' has two at least one metal bumps 405 formed on the front-side of the substrate 401. The front-side of the substrate 401 is facing downwards. The semiconductor chip 4F' is stacked on the semiconductor chip 2F" by the one at least one metal bump 205 and the two at least one metal bumps 405 (formed on the front-side of the substrate 401). The solder layer 211 is the adhesion for bonding the semiconductor chip 4F' and the one at least one metal bump 205. The solder layer 411 is the adhesion for bonding the semiconductor chip 2F" and the two at least one metal bumps 405 (formed on the front-side of the substrate 401). A semiconductor chip 1G is stacked on the at least one metal bump 405 formed on the backside of the substrate 401 of the semiconductor chip 4F'. The solder layer 411 is the adhesion for bonding the semiconductor chip 1G and the at least one metal bump 205 formed on the backside of the substrate 401. The semiconductor chip 1G may be any one of the semiconductor chip shown in FIG. 1C, FIG. 1D, FIG. 1E, FIG. 2A~FIG. 2F, FIG. 3A~FIG. 3F, and FIG. 4A~FIG. 4F.

Figure 7F:
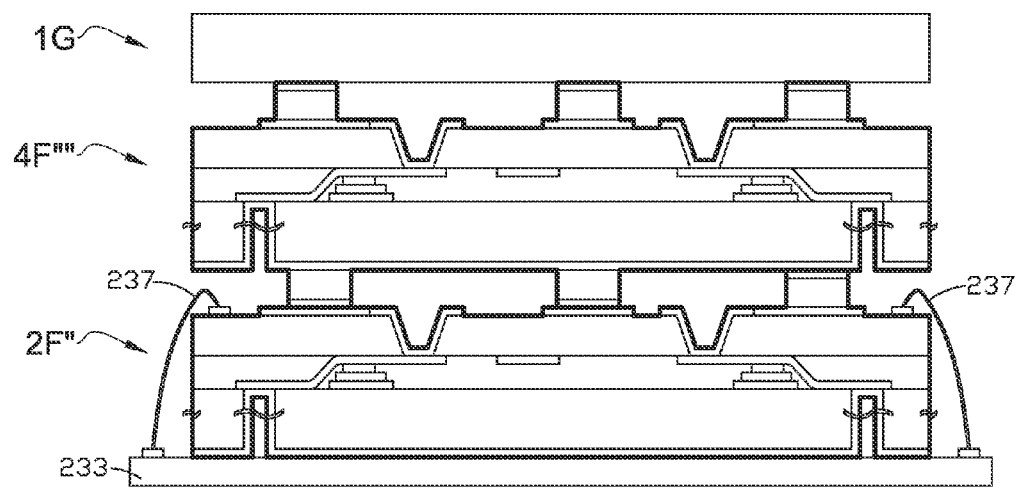

FIG. 7F is a schematic showing the cross-sectional view of another embodiment of a stacked structure including two semiconductor chips with substrate via holes and metal bumps provided by the present invention. The structure is mostly similar to the structure shown in FIG. 7D, except that the semiconductor chip 4F' is replaced by a semiconductor chip 4F''''. The structure of the semiconductor chip 4F'''' is mostly similar to the structure shown in FIG. 4F, except that the structure shown in FIG. 4F has three at least one metal bumps 405 formed on the backside of the substrate 401 while the structure of the semiconductor chip 4F'''' has two at least one metal bumps 405 formed on the backside of the substrate 401. The front-side of the substrate 401 is facing upwards.

Figure 7G:
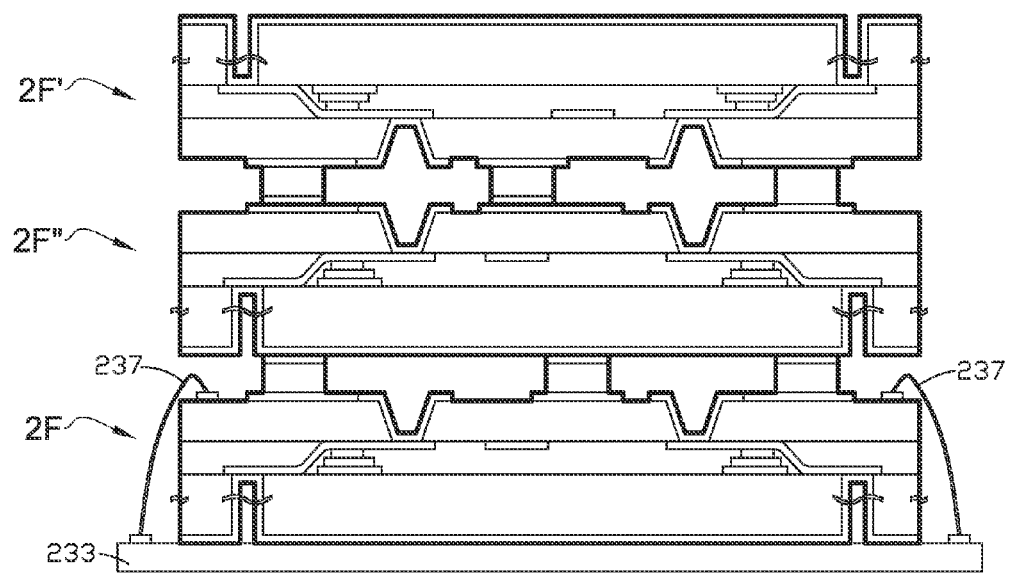
FIG. 7G and FIG. 7H are the schematics showing the cross-sectional view of the embodiments of a stacked structure including three semiconductor chips with substrate via holes and metal bumps provided by the present invention.

FIG. 7G is a schematic showing the cross-sectional view of an embodiment of a stacked structure including three semiconductor chips with substrate via holes and metal bumps provided by the present invention. The structure is mostly similar to the structure shown in FIG. 6E, except that the structure further comprises a semiconductor chip 2F inserted in between the module substrate 233 and the semiconductor chip 2F''.

Figure 7H:
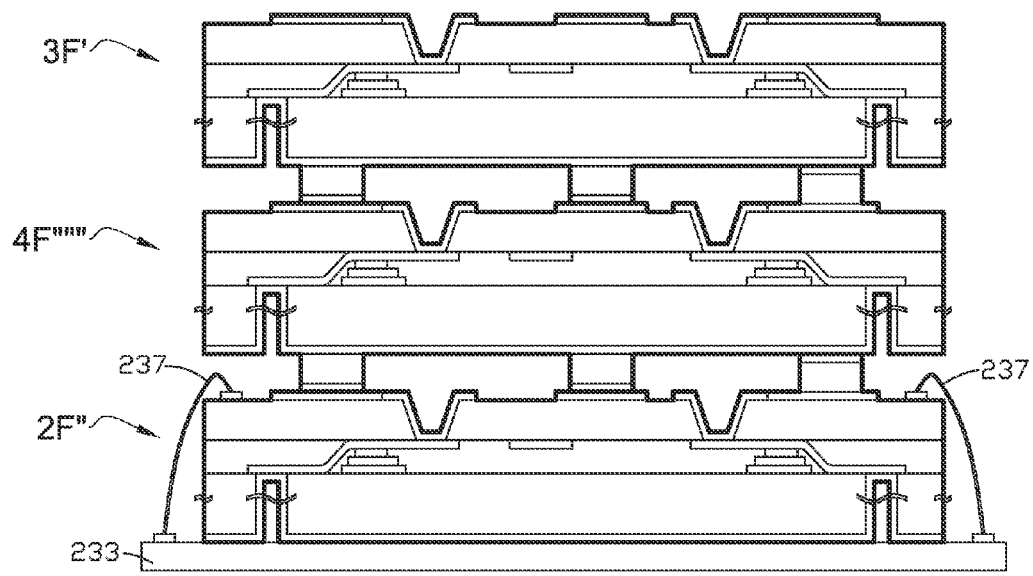

FIG. 7H is a schematic showing the cross-sectional view of an embodiment of a stacked structure including three semiconductor chips with substrate via holes and metal bumps provided by the present invention. The structure is mostly similar to the structure shown in FIG. 6D, except that the structure further comprises a semiconductor chip 4F''''' inserted in between the semiconductor chip 2F'' and the semiconductor chip 3F'. The structure of the semiconductor chip 4F''''' is mostly similar to the structure shown in FIG. 4F, except that the structure shown in FIG. 4F has three at least one metal bumps 405 formed on the front-side of the substrate 401 and three at least one metal bumps 405 formed on the backside of the substrate 401 while the structure of the semiconductor chip 4F''''' has only one at least one metal bump 405 formed on the front-side of the substrate 401 and two at least one metal bumps 405 formed on the backside of the substrate 401.

Figure 7I:
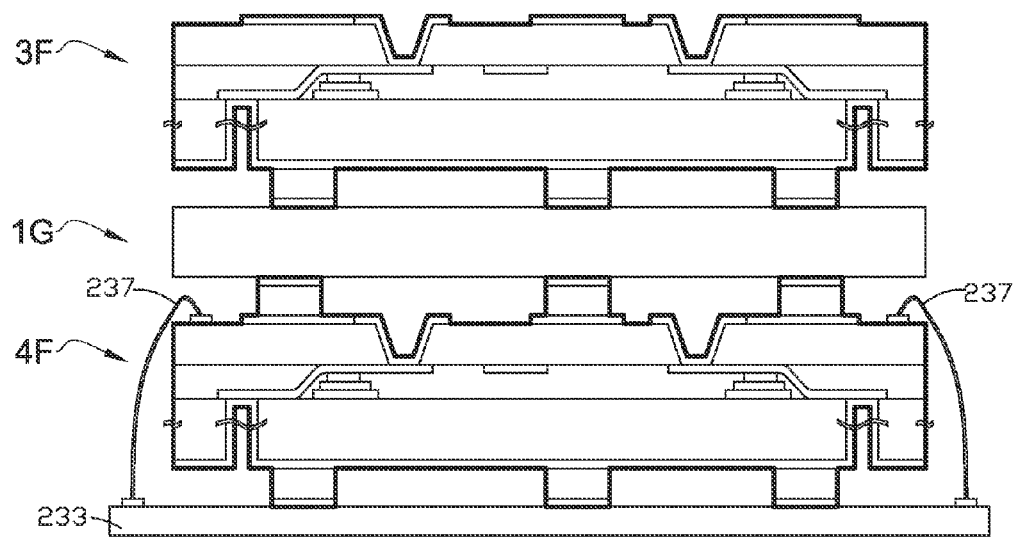
FIG. 7I~FIG. 7K are the schematics showing the cross-sectional view of the embodiments of a stacked structure including two semiconductor chips with substrate via holes and metal bumps provided by the present invention.

FIG. 7I is a schematic showing the cross-sectional view of an embodiment of a stacked structure including two semiconductor chips with substrate via holes and metal bumps provided by the present invention. The structure is mostly similar to the structure shown in FIG. 6B, except that the structure further comprises a semiconductor chip 3F stacked on the semiconductor chip 1G.

Figure 7J:
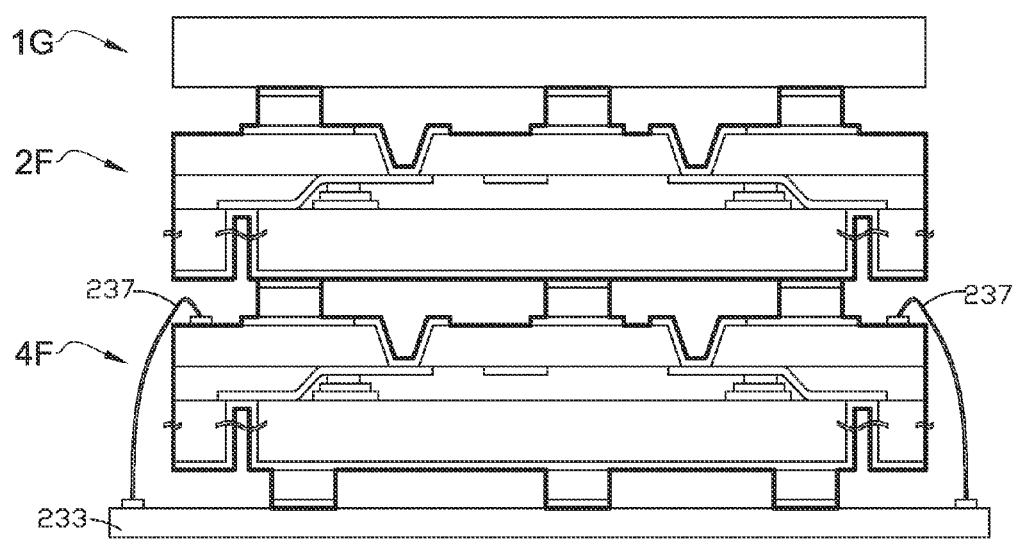

FIG. 7J is a schematic showing the cross-sectional view of an embodiment of a stacked structure including two semiconductor chips with substrate via holes and metal bumps provided by the present invention. The structure is mostly similar to the structure shown in FIG. 6B, except that the structure further comprises a semiconductor chip 2F inserted in between the semiconductor chip 4F and the semiconductor chip 1G.

Figure 7K:
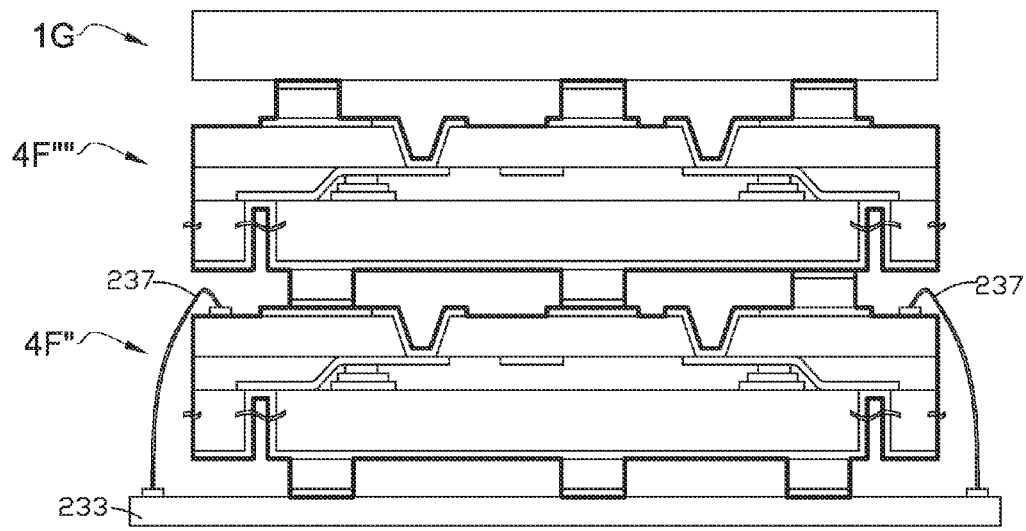

FIG. 7K is a schematic showing the cross-sectional view of another embodiment of a stacked structure including two semiconductor chips with substrate via holes and metal bumps provided by the present invention. The structure is mostly similar to the structure shown in FIG. 7F, except that the semiconductor chip 2F'' is replaced by a semiconductor chip 4F'''.

Figure 7L:
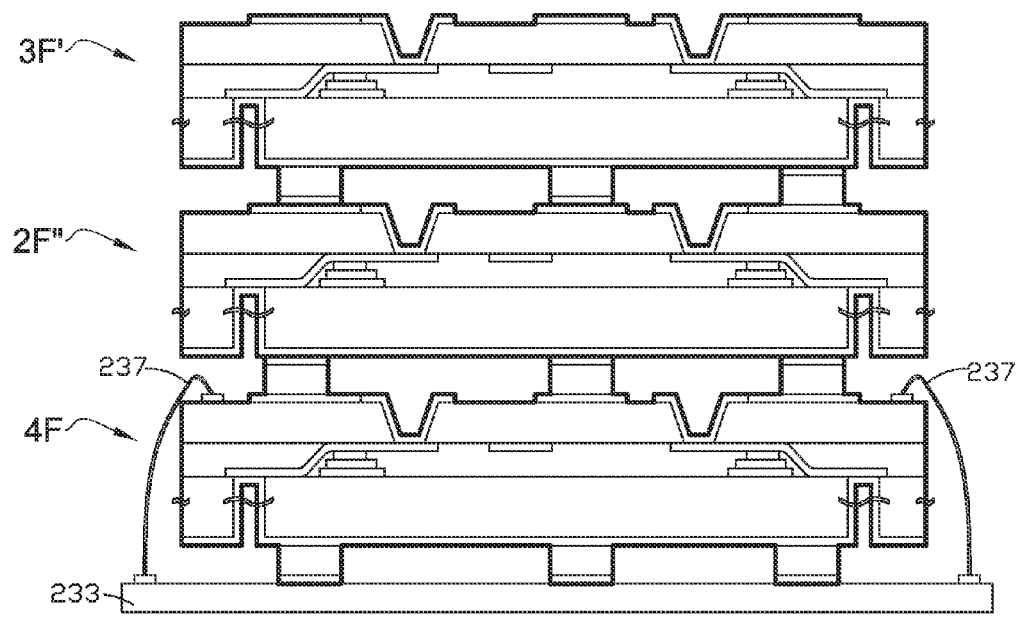
FIG. 7L~FIG. 7N are the schematics showing the cross-sectional view of the embodiments of a stacked structure including three semiconductor chips with substrate via holes and metal bumps provided by the present invention.

FIG. 7L is a schematic showing the cross-sectional view of an embodiment of a stacked structure including three semiconductor chips with substrate via holes and metal bumps provided by the present invention. The structure is mostly similar to the structure shown in FIG. 6D, except that the structure further comprises a semiconductor chip 4F inserted in between the module substrate 233 and the semiconductor chip 2F'''.

Figure 7M:
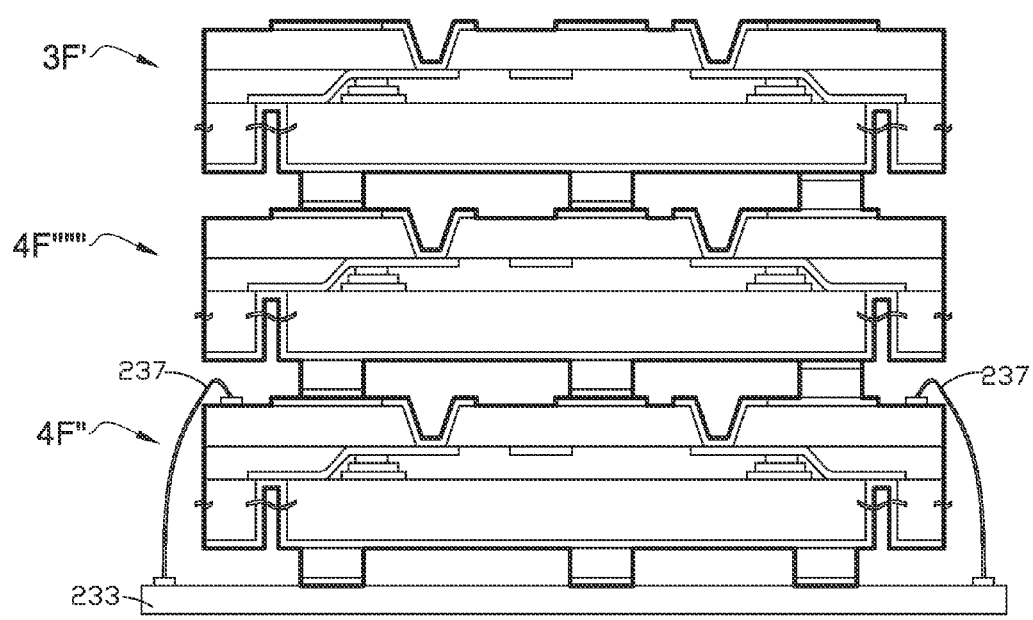

FIG. 7M is a schematic showing the cross-sectional view of another embodiment of a stacked structure including three semiconductor chips with substrate via holes and metal bumps provided by the present invention. The structure is mostly similar to the structure shown in FIG. 7H, except that the semiconductor chip 2F''' is replaced by a semiconductor chip 4F'''.

Figure 7N:
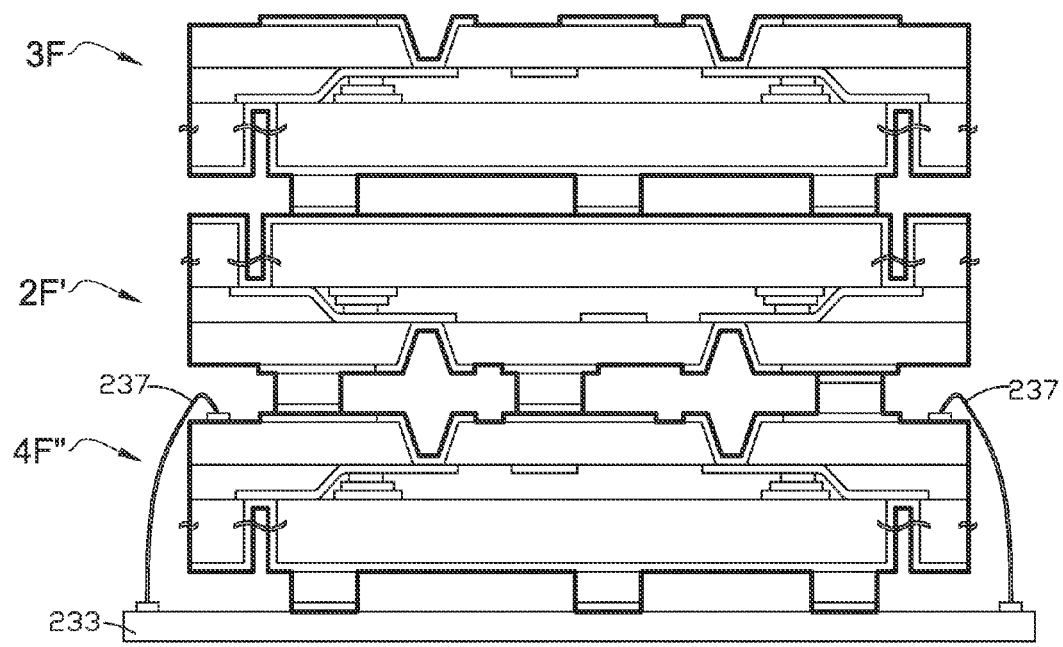

FIG. 7N is a schematic showing the cross-sectional view of an embodiment of a stacked structure including three semiconductor chips with substrate via holes and metal bumps provided by the present invention. The structure is mostly similar to the structure shown in FIG. 6F, except that the structure further comprises a semiconductor chip 3F stacked on the structure shown in FIG. 6F.

Figure 7O:
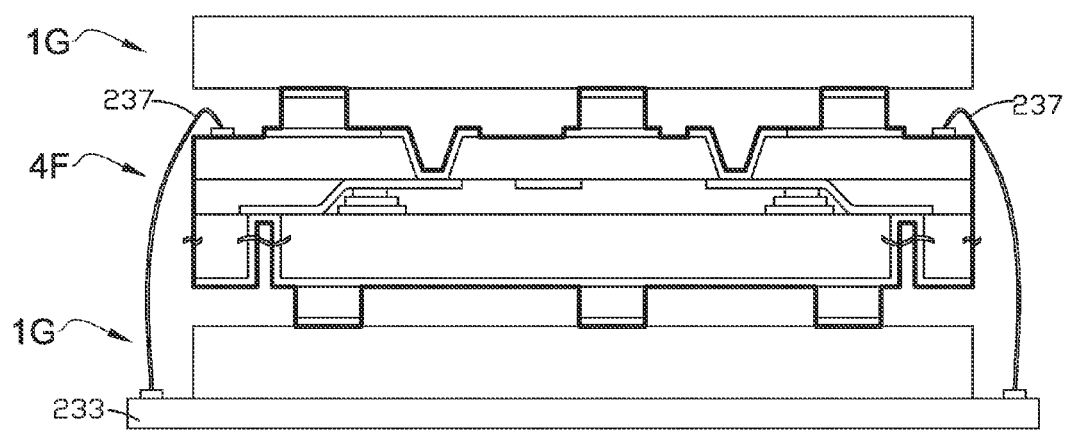
FIG. 7O is a schematic showing the cross-sectional view of an embodiment of a stacked structure including a semiconductor chip with substrate via holes and metal bumps provided by the present invention.

FIG. 7O is a schematic showing the cross-sectional view of an embodiment of a stacked structure including two semiconductor chips with substrate via holes and metal bumps provided by the present invention. The structure is mostly similar to the structure shown in FIG. 6B, except that the structure further comprises a semiconductor chip 1G inserted in between the module substrate 233 and the semiconductor chip 4F. The semiconductor chip 1G may be any one of the semiconductor chip shown in FIG. 1C, FIG. 1D, FIG. 1E, FIG. 2A~FIG. 2F, FIG. 3A~FIG. 3F, and FIG. 4A~FIG. 4F.

With the embodiment of a semiconductor chip with substrate via holes and metal bumps provided by the present invention, it is possible to stack more than two semiconductor chips. It is possible to stack four, five, or even more semiconductor chips, which largely reduce the area of the chip size.

To sum up, the stacked structure including at least one semiconductor chip with substrate via holes and metal bumps provided by the present invention can improve the integration of the devices in the semiconductor chip, reduce the chip size, increase the signal transmission speed, lower the electric power consumption, and achieve heterogeneous integration. The present invention can indeed get its anticipated object, and furthermore, the present invention can indeed improve the process stability and the device reliability.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A stacked structure, comprising:
    a first semiconductor chip, which includes:
        a first substrate having at least one first substrate via hole penetrating through said first substrate;
        at least one first backside metal layer formed on a backside of said first substrate and covering an inner surface of said at least one first substrate via hole and at least part of said backside of said first substrate;
        at least one first front-side metal layer formed on a front-side of said first substrate, wherein said at least one first front-side metal layer is electrically connected to said at least one first backside metal layer on a top of at least one of said at least one first substrate via hole;
        at least one first electronic device formed on said front-side of said first substrate, wherein at least one of said at least one first electronic device is electrically connected to said at least one first front-side metal layer; and
        at least one first metal bump formed on at least one of said at least one first backside metal layer and said at least one first front-side metal layer.

2. The stacked structure according to claim 1, further comprising a second semiconductor chip, which includes:
    a second substrate;
    at least one second front-side metal layer formed on a front-side of said second substrate; and
    at least one second electronic device formed on said front-side of said second substrate, wherein at least one of said at least one second electronic device is electrically connected to said at least one second front-side metal layer;
    wherein said second semiconductor chip is stacked on or below said first semiconductor chip, wherein said first semiconductor chip and said second semiconductor chip are electrically connected.

3. The stacked structure according to claim 2, wherein said second semiconductor chip further comprises at least one second metal bump formed on said at least one second front-side metal layer, wherein said first semiconductor chip and said second semiconductor chip are electrically connected by at least one of said at least one first metal bump and said at least one second metal bump.

4. The stacked structure according to claim 3, wherein said second semiconductor chip further comprises a second solder layer deposited on each of said at least one second metal bump, and wherein said second solder layer is made of In, Sn, In alloys, Sn alloys, or In—Sn alloys.

5. The stacked structure according to claim 3, wherein said second substrate has at least one second substrate via hole penetrating through said second substrate, and wherein said second semiconductor chip further comprises at least one second backside metal layer formed on a backside of said second substrate and covering an inner surface of said at least one second substrate via hole and at least part of said backside of said second substrate, wherein said at least one second front-side metal layer is electrically connected to said at least one second backside metal layer on a top of at least one of said at least one second substrate via hole, wherein said at least one second metal bump is formed on at least one of said at least one second front-side metal layer and said at least one second backside metal layer.

6. The stacked structure according to claim 3, wherein said second semiconductor chip further comprises a second passivation layer inserted between said front-side of said second substrate and said at least one second metal bump, wherein said second passivation layer covers at least part of said second substrate, said at least one second electronic device, and at least part of said at least one second front-side metal layer, and wherein at least part of said at least one second front-side metal layer is not covered by said second passivation layer.

7. The stacked structure according to claim 6, wherein said second semiconductor chip further comprises a second redistribution layer inserted between said second passivation layer and said at least one second metal bump, wherein said second redistribution layer comprises:
    at least one second dielectric layer formed above said second passivation layer and said at least one second front-side metal layer to cover at least part of said second substrate, said second passivation layer, and at least part of said at least one second front-side metal layer, wherein said at least one second dielectric layer has at least one second dielectric layer via hole penetrating through said at least one second dielectric layer; and at least one second extended front-side metal layer formed on said second dielectric layer to cover said at least one second dielectric layer via hole and at least part of said at least one second dielectric layer, wherein said at least one second extended front-side metal layer is electrically connected to said at least one second front-side metal layer, wherein said at least one second metal bump is formed on said at least one second extended front-side metal layer.

8. The stacked structure according to claim 2, further comprising a third semiconductor chip, which includes:
a third substrate;
at least one third front-side metal layer formed on a front-side of said third substrate; and
at least one third electronic device formed on said front-side of said third substrate, wherein at least one of said at least one third electronic device is electrically connected to said at least one third front-side metal layer;
wherein said third semiconductor chip is stacked below or stacked on and below said first semiconductor chip, wherein said first semiconductor chip and said third semiconductor chip are electrically connected.

9. The stacked structure according to claim 8, wherein said third semiconductor chip further comprises at least one third metal bump formed on said at least one third front-side metal layer, wherein said first semiconductor chip and said third semiconductor chip are electrically connected by at least one of said at least one first metal bump and said at least one third metal bump.

10. The stacked structure according to claim 9, wherein said third semiconductor chip further comprises a third solder layer deposited on each of said at least one third metal bump, and wherein said third solder layer is made of In, Sn, In alloys, Sn alloys, or In—Sn alloys.

11. The stacked structure according to claim 9, wherein said third substrate has at least one third substrate via hole penetrating through said third substrate, and wherein said third semiconductor chip further comprises at least one third backside metal layer formed on a backside of said third substrate and covering an inner surface of said at least one third substrate via hole and at least part of said backside of said third substrate, wherein said at least one third front-side metal layer is electrically connected to said at least one third backside metal layer on a top of at least one of said at least one third substrate via hole, wherein said at least one third metal bump is formed on at least one of said at least one third front-side metal layer and said at least one third backside metal layer.

12. The stacked structure according to claim 9, wherein said third semiconductor chip further comprises a third passivation layer inserted between said front-side of said third substrate and said at least one third metal bump, wherein said third passivation layer covers at least part of said third substrate, said at least one third electronic device, and at least part of said at least one third front-side metal layer, and wherein at least part of said at least one third front-side metal layer is not covered by said third passivation layer.

13. The stacked structure according to claim 12, wherein said third semiconductor chip further comprises a third redistribution layer inserted between said third passivation layer and said at least one third metal bump, wherein said third redistribution layer comprises:
at least one third dielectric layer formed above said third passivation layer and said at least one third front-side metal layer to cover at least part of said third substrate, said third passivation layer, and at least part of said at least one third front-side metal layer, wherein said at least one third dielectric layer has at least one third dielectric layer via hole penetrating through said at least one third dielectric layer; and
at least one third extended front-side metal layer formed on said third dielectric layer to cover said at least one third dielectric layer via hole and at least part of said at least one third dielectric layer, wherein said at least one third extended front-side metal layer is electrically connected to said at least one third front-side metal layer, wherein said at least one third metal bump is formed on said at least one third extended front-side metal layer.

14. The stacked structure according to claim 3, further comprising a third semiconductor chip, which includes:
a third substrate;
at least one third front-side metal layer formed on a front-side of said third substrate; and
at least one third electronic device formed on said front-side of said third substrate, wherein at least one of said at least one third electronic device is electrically connected to said at least one third front-side metal layer;
wherein said third semiconductor chip is stacked on or below said second semiconductor chip, wherein said second semiconductor chip and said third semiconductor chip are electrically connected.

15. The stacked structure according to claim 14, wherein said third semiconductor chip further comprises at least one third metal bump formed on said at least one third front-side metal layer, wherein said second semiconductor chip and said third semiconductor chip are electrically connected by at least one of said at least one second metal bump and said at least one third metal bump.

16. The stacked structure according to claim 15, wherein said third semiconductor chip further comprises a third-chip solder layer deposited on each of said at least one third metal bump, and wherein said third-chip solder layer is made of In, Sn, In alloys, Sn alloys, or In—Sn alloys.

17. The stacked structure according to claim 15, wherein said third substrate has at least one third substrate via hole penetrating through said third substrate, and wherein said third semiconductor chip further comprises at least one third-chip backside metal layer formed on a backside of said third substrate and covering an inner surface of said at least one third substrate via hole and at least part of said backside of said third substrate, wherein said at least one third front-side metal layer is electrically connected to said at least one third-chip backside metal layer on a top of at least one of said at least one third substrate via hole, wherein said at least one third metal bump is formed on at least one of said at least one third front-side metal layer and said at least one third-chip backside metal layer.

18. The stacked structure according to claim 15, wherein said third semiconductor chip further comprises a third-chip passivation layer inserted between said front-side of said third substrate and said at least one third metal bump, wherein said third-chip passivation layer covers at least part of said third substrate, said at least one third electronic device, and at least part of said at least one third front-side metal layer, and wherein at least part of said at least one third front-side metal layer is not covered by said third-chip passivation layer.

19. The stacked structure according to claim 18, wherein said third semiconductor chip further comprises a third-chip redistribution layer inserted between said third-chip passivation layer and said at least one third metal bump, wherein said third redistribution-chip layer comprises:
at least one third-chip dielectric layer formed above said third-chip passivation layer and said at least one third front-side metal layer to cover at least part of said third substrate, said third-chip passivation layer, and at least part of said at least one third front-side metal layer, wherein said at least one third-chip dielectric layer has at least one third-chip dielectric layer via hole penetrating through said at least one third-chip dielectric layer; and
at least one third-chip extended front-side metal layer formed on said third-chip dielectric layer to cover said at least one third-chip dielectric layer via hole and at least part of said at least one third-chip dielectric layer, wherein said at least one third-chip extended front-side metal layer is electrically connected to said at least one third front-side metal layer, wherein said at least one third metal bump is formed on said at least one third-chip extended front-side metal layer.

20. The stacked structure according to claim 1, wherein said first semiconductor chip further comprises a first passivation layer inserted between said front-side of said first substrate and said at least one first metal bump, wherein said first passivation layer covers at least part of said first substrate, said at least one first electronic device, and at least part of said at least one first front-side metal layer, and wherein at least part of said at least one first front-side metal layer is not covered by said first passivation layer.

21. The stacked structure according to claim 20, wherein said first passivation layer is made of SiN.

22. The stacked structure according to claim 20, wherein said first semiconductor chip further comprises a first redistribution layer inserted between said first passivation layer and said at least one first metal bump, wherein said first redistribution layer comprises:
at least one first dielectric layer formed above said first passivation layer and said at least one first front-side metal layer to cover at least part of said first substrate, said first passivation layer, and at least part of said at least one first front-side metal layer, wherein said at least one first dielectric layer has at least one first dielectric layer via hole penetrating through said at least one first dielectric layer; and
at least one first extended front-side metal layer formed on said first dielectric layer to cover said at least one first dielectric layer via hole and at least part of said at least one first dielectric layer, wherein said at least one first extended front-side metal layer is electrically connected to said at least one first front-side metal layer, wherein said at least one first metal bump is formed on said at least one first extended front-side metal layer.

23. The stacked structure according to claim 22, wherein said at least one first dielectric layer is made of dielectric material Polybenzoxazole (PBO).

24. The stacked structure according to claim 22, wherein said at least one first front-side metal layer is made of Au, Cu, Au alloys or Cu alloys, wherein said at least one first extended front-side metal layer is made of Au, Cu, Au alloys or Cu alloys.

25. The stacked structure according to claim 1, wherein said first substrate is made of GaAs, SiC, GaN, GaN film on SiC or InP.

26. The stacked structure according to claim 1, wherein said first semiconductor chip further comprises a first solder layer deposited on each of said at least one first metal bump, and wherein said first solder layer is made of In, Sn, In alloys, Sn alloys, or In—Sn alloys.

27. The stacked structure according to claim 1, wherein a thickness of said first substrate is greater than 10 μm and smaller than 300 μm.

28. The stacked structure according to claim 1, wherein said at least one first backside metal layer is made of Au, Cu, Pd, Ni, Ag, Ni alloys, Au alloys, Ni—Au alloys, Ni—Pd alloys, or Pd—Au alloys.

29. The stacked structure according to claim 1, wherein said at least one first metal bump is made of Cu, Au or Cu alloys.

30. A stacked structure comprising:
a first semiconductor chip, which includes:
a first substrate having at least one first substrate via hole penetrating through said first substrate;
at least one first backside metal layer formed on a backside of said first substrate and covering an inner surface of said at least one first substrate via hole and at least part of said backside of said first substrate;
at least one first front-side metal layer formed on a front-side of said first substrate, wherein said at least one first front-side metal layer is electrically connected to said at least one first backside metal layer on a top of at least one of said at least one first substrate via hole;
at least one first electronic device formed on said front-side of said first substrate, wherein at least one of said at least one first electronic device is electrically connected to said at least one first front-side metal layer; and
at least one first metal bump formed on at least one of said at least one first backside metal layer and said at least one first front-side metal layer;
a second semiconductor chip, which includes:
a second substrate;
at least one second front-side metal layer formed on a front-side of said second substrate; and
at least one second electronic device formed on said front-side of said second substrate, wherein at least one of said at least one second electronic device is electrically connected to said at least one second front-side metal layer; wherein said second semiconductor chip is stacked on or below said first semiconductor chip, wherein said first semiconductor chip and said second semiconductor chip are electrically connected; and
at least one second metal bump formed on said at least one second front-side metal layer, wherein said first semiconductor chip and said second semiconductor chip are electrically connected by at least one of said at least one first metal bump and said at least one second metal bump; and
a third semiconductor chip, which includes:
a third substrate;
at least one third front-side metal layer formed on a front-side of said third substrate;
at least one third electronic device formed on said front-side of said third substrate, wherein at least one of said at least one third electronic device is electrically connected to said at least one third front-side metal layer; wherein said third semiconductor chip is stacked on or below said second semiconductor chip, wherein said second semiconductor chip and said third semiconductor chip are electrically connected;

at least one third metal bump formed on said at least one third front-side metal layer, wherein said second semiconductor chip and said third semiconductor chip are electrically connected by at least one of said at least one second metal bump and said at least one third metal bump;

a third-chip passivation layer inserted between said front-side of said third substrate and said at least one third metal bump, wherein said third-chip passivation layer covers at least part of said third substrate, said at least one third electronic device, and at least part of said at least one third front-side metal layer, and wherein at least part of said at least one third front-side metal layer is not covered by said third-chip passivation layer; and a third-chip redistribution layer inserted between said third-chip passivation layer and said at least one third metal bump, wherein said third-chip redistribution layer comprises:

at least one third-chip dielectric layer formed above said third-chip passivation layer and said at least one third front-side metal layer to cover at least part of said third substrate, said third-chip passivation layer, and at least part of said at least one third front-side metal layer, wherein said at least one third-chip dielectric layer has at least one third-chip dielectric layer via hole penetrating through said at least one third-chip dielectric layer; and at least one third-chip extended front-side metal layer formed on said third-chip dielectric layer to cover said at least one third-chip dielectric layer via hole and at least part of said at least one third-chip dielectric layer, wherein said at least one third-chip extended front-side metal layer is electrically connected to said at least one third front-side metal layer, wherein said at least one third metal bump is formed on said at least one third-chip extended front-side metal layer.

* * * * *